United States Patent [19]

Matsumoto et al.

[11] Patent Number: 5,323,354
[45] Date of Patent: Jun. 21, 1994

[54] SEMICONDUCTOR MEMORY DEVICE INCLUDING ARRANGEMENTS TO FACILITATE BATTERY BACKUP

[75] Inventors: Miki Matsumoto, Ohme; Katsuyuki Sato, Akishima, both of Japan

[73] Assignee: Hitachi, Ltd., Tokyo, Japan

[21] Appl. No.: 836,597

[22] Filed: Feb. 18, 1992

[30] Foreign Application Priority Data

Feb. 15, 1991 [JP] Japan ................... 3-042876

[51] Int. Cl.$^5$ ........................................... H03K 3/01
[52] U.S. Cl. ..................... 365/229; 365/222; 365/227
[58] Field of Search ............ 365/229, 228, 52, 230.05, 365/236, 222, 189.09; 307/578, 482, 296.1, 296.2

[56] References Cited

U.S. PATENT DOCUMENTS

| | | | |
|---|---|---|---|
| 4,964,082 | 10/1990 | Sato et al. | 365/189.09 |
| 4,984,211 | 2/1991 | Tran | 365/229 |
| 4,985,869 | 2/1991 | Miyamoto | 365/222 |
| 4,987,559 | 2/1991 | Miyauchi et al. | 365/230.05 |
| 5,134,589 | 7/1992 | Hamano | 368/230.05 |
| 5,146,430 | 9/1992 | Torimaru et al. | 365/222 |

Primary Examiner—Eugene R. LaRoche
Assistant Examiner—Vu A. Le
Attorney, Agent, or Firm—Antonelli, Terry, Stout & Kraus

[57] ABSTRACT

A multi-port memory is provided which is capable of being backed up by a battery to provide a resume function for a digital processor. In a preferred embodiment, a resume function can be provided for a VRAM without restricting the bit rate of image data or the function of the frame memory. Preferably, the memory includes a memory array MARY of memory cells of stereoscopic structure. A high voltage VCH for word line selection can be generated by a voltage-doubling word boost circuit which has its boosting ratio switched stepwise in accordance with the potential of an internal supply voltage. Moreover, a substrate potential generator is provided which has a first substrate potential generator having a relatively low current supplying capacity, which is steadily brought into an operative state, and a second substrate potential generator having a relatively high current supplying capacity which is selectively brought into an operative state. During battery backup, the multi-port memory is in a self-refresh memory. Also, the number of memory mats to be simultaneously activated in the self-refresh mode is made larger than that in the ordinary mode, and a refresh timer circuit RTM for setting the refresh period is of a diffusion layer leakage type.

24 Claims, 12 Drawing Sheets

NORMAL MODE

SELFREFRESH MODE

SEMICONDUCTOR MEMORY DEVICE INCLUDING ARRANGEMENTS TO FACILITATE BATTERY BACKUP

BACKGROUND OF THE INVENTION

The present invention relates to a semiconductor memory device and, more particularly, to technology which is especially effective when used in a multi-port memory contained in a frame member of a digital processor system as a personal computer or work station.

Multi-port memories are known which include random access ports and serial access ports. Such memories can have a raster computing function and a flashing light function or the like, and are effective as a frame memory. Digital processor systems such as a personal computer or work station are also known, which include a display device using a CRT (i.e., cathode ray tube) or the like, and a frame memory having a serial access memory such as the aforementioned multi-port memory for transmitting a series of image data to the display device.

On the other hand, it is becoming the current practice that personal computers or work stations are given the so-called "resume function", in which the displayed content of a display device is held in the frame memory even after interruption of the power supply so that the displayed content before the interruption may be instantly resumed. Digital processor systems having such a resume function are required to enable at least the serial access memory constituting the frame memory to be backed up by a battery.

An example of a multi-port memory having random access ports and serial access ports is disclosed in Japanese Patent Laid-Open No. 293791/1988. On the other hand, a digital processor system having the resume function is disclosed, for example, on pages 18 and 19 of "DynaBook J-310OSS DynaBook Guide" issued by Toshiba Corp., on Jul. 6, 1989.

The multi-port memory of the prior art described above is not provided with the so-called "backup model" so that it cannot be backed up by a battery. As a result, the existing digital processor systems having the resume function adopt a method of using an ordinary static RAM (i.e., random access memory) having the battery backup mode. However, the ordinary static RAM is not equipped with the serial access ports nor is it given special functions such as a raster computing function or a flashing light function for matching the frame memory effectively. This raises a problem that the bit rate of the image data is limited to restrict the function as a frame memory, although the resume function can be achieved. Incidentally, an example of a static RAM having the battery backup mode is disclosed on pages 250 to 259 of "Hitachi IC Memory Data", issued in September, 1989 by Hitachi, Ltd.

SUMMARY OF THE INVENTION

An object of the present invention is to provide a multi-port memory which can be backed up by a battery. Another object of the present invention is to realize the resume function of a digital processor system without restricting the bit rate of image data or the function as a frame memory.

To achieve these and other objects, a multi-port memory has its memory array composed of memory cells of stereoscopic structure such as STC cells, and a high voltage to be selectively transmitted as a selection level to a word line to be brought into a selected state is generated by a voltage-doubling word boost circuit which has its boosting ratio stepwise switched in accordance with the potential of an internal supply voltage. Moreover, a substrate potential generator is constructed of a first substrate potential generator having a relatively low current supply capacity and adapted to be steadily brought into an operative state, and a second substrate potential generator having a relatively high current supply capacity and adapted to be selectively brought into an operative state in accordance with an output voltage of a level detector. The discrimination of a substrate potential by the level detector is accomplished by monitoring the charge current of a charge pump capacity contained in the substrate potential generator. Moreover, a refresh timer circuit for bringing the multi-port memory into a self-refresh mode, when backed up by the battery, for having a larger number of memory mats to be simultaneously activated in the self-refresh mode than that of the memory cells in the ordinary memory, and for setting a refresh period, is exemplified by a diffusion layer leakage timer circuit.

According to the above-specified means, the data holding characteristics of the memory cells are improved, and the multi-port memory can have its power consumption reduced to be backed up by the battery. This can be accomplished while retaining a refresh period matching the data holding characteristics of the memory cells and a sufficient word line selecting level, even if the supply voltage is switched to that of the battery to have its absolute value reduced. As a result, the resume function of the digital processor system or the like containing the multi-port memory can be realized without restricting the bit rate of the image data or the function as a frame memory.

DETAILED DESCRIPTION OF THE INVENTION

1. System Structure of a Personal Computer and Features of the Same

Figure 1:
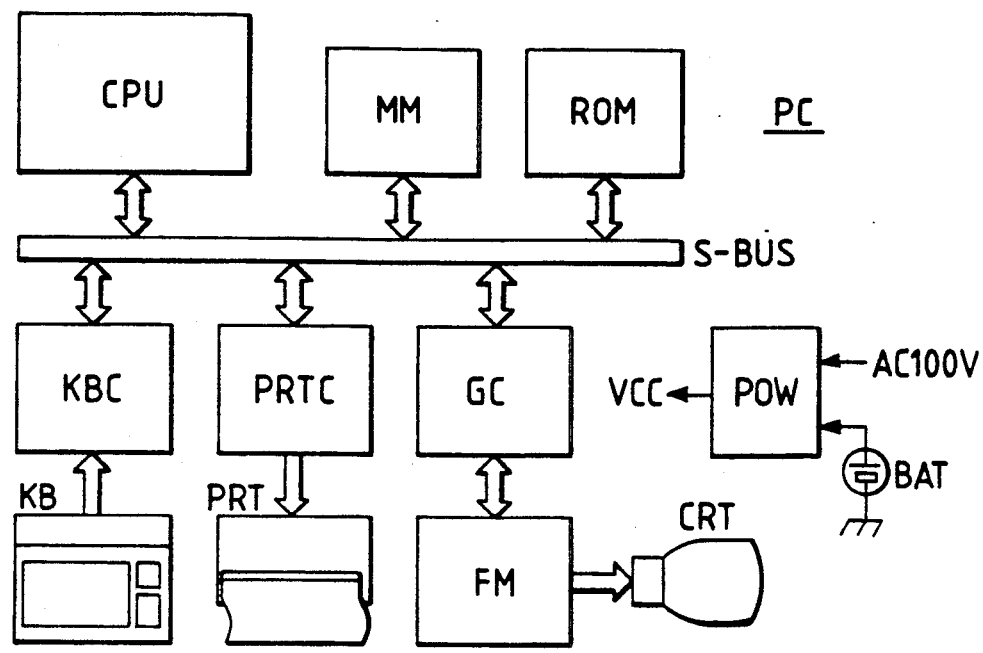
FIG. 1 is a diagram showing the system structure of one embodiment of a personal computer according to the present invention.
Figure 2:
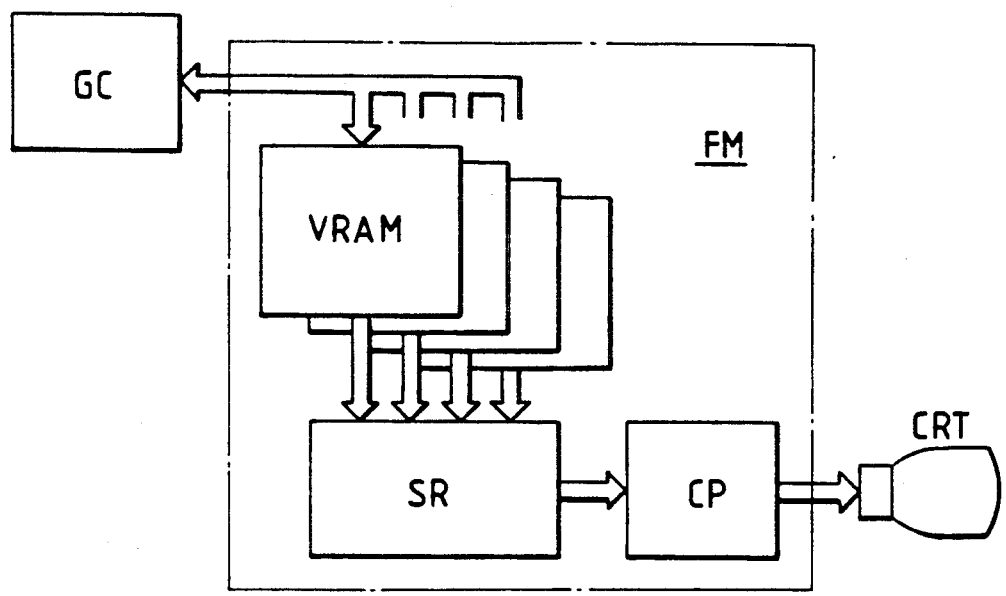
FIG. 2 is a block diagram showing one embodiment of the frame memory contained in the personal computer of FIG. 1.

FIG. 1 is a block diagram showing a system structure of one embodiment of a personal computer PC (or digital processor system) according to the present invention. Moreover, FIG. 2 is a block diagram showing one embodiment of a frame memory FM included in the personal computer PC of FIG. 1. First of all, the summary of the structure and operation of the personal computer of the present embodiment will be described together with the features thereof.

In FIG. 1, the personal computer PC of this embodiment is constructed mainly of a central processing unit CPU. This central processing unit CPU is a stored program type processor system, although not especially limited thereto, and is equipped with an arithmetic logic unit for various arithmetic processing operations and a control unit for controlling the computer in entirety. The central processing unit CPU is further equipped with a work storage area such as a cache memory or register for latching the arithmetic data temporarily.

The central processing unit CPU is coupled to a system bus S-BUS which is composed of an address bus, a data bus and a control bus, although not especially limited thereto. To this central processing unit CPU, there are connected a main memory mm composed of a plurality of dynamic RAMs and a read only memory ROM composed of mask memories for storing a program or fixed data, although not especially limited thereto. Further coupled to the CPU are a keyboard controller KBC, a printer controller PRTC and a graphic controller GC. Of these, the keyboard controller KBC is coupled to a printer PRT. Moreover, the graphic controller GC is coupled to a frame memory FM, which in turn is coupled to the display device CRT using a cathode-ray tube CRT.

As shown in FIG. 2, the frame memory FM can include four multi-port video memories VRAM, a serial register SR and a color pallet CP, although not especially limited thereto. Of these, each of the multi-port memories VRAM is equipped with a random access port and a serial access port, as will be described hereinafter. The random access port of each multi-port memory is instructed by the graphic controller GC, although not especially limited thereto, to write image data at a unit of 8 bits at random in an assigned address, or to read them out. On the other hand, the serial access port reads out all the image data relating to an assigned word line at a bit rate of one quarter of that of the display device CRT from the graphic controller GC and outputs them to the serial register SR. The image data is subjected to parallel-serial conversions by the serial register SR, and are transmitted through the color pallet CP to the display device CRT. Incidentally, the serial outputting operation by the serial access port of each multi-port memory is uninterruptedly performed even at the switching of word lines so that the continuity of the image data is maintained.

The personal computer PC is further equipped with a power supply POW, although not especially limited thereto. This power supply POW is supplied from the outside with an AC power of AC 100 V and from a built-in battery BAT with a DC power of +2.6 V, although not especially limited thereto. The power supply POW generates a DC supply voltage VCC of +5 V under the AC power supply of AC 100 V, when the main switch of the personal computer PC is turned on, and supplies it to each portion of the personal computer PC. When the main switch is turned off, the personal computer PC is in the so-called "battery backup state". At this time, the power supply POW feeds the DC power of +2.6 V supplied from the battery BAT as the DC supply voltage VCC to each portion of the personal computer PC.

In this embodiment, the multi-port memory VRAM composing the frame memory FM is given a special function such as a raster arithmetic function or flashing light function so that it can fit the frame memory effectively. Moreover, this multi-port memory is devised in various manners for improving the data holding characteristics of the memory cells to reduce the operating current, as will be described hereinafter, so that it can make the battery backup possible. In the personal computer PC of this embodiment, furthermore, the work storage of the main memory MM or the central processing unit CPU is likewise composed of such a dynamic or static RAM as can be backed up by the battery, so that the total system can be backed up by the battery. As a result, in the personal computer PC of this embodiment, the resume function can be realized without restricting the bit rate of the image data or the function of the frame memory FM.

2. Block Structure of the Multi-Port Memory and Features of the Same

Figure 3:
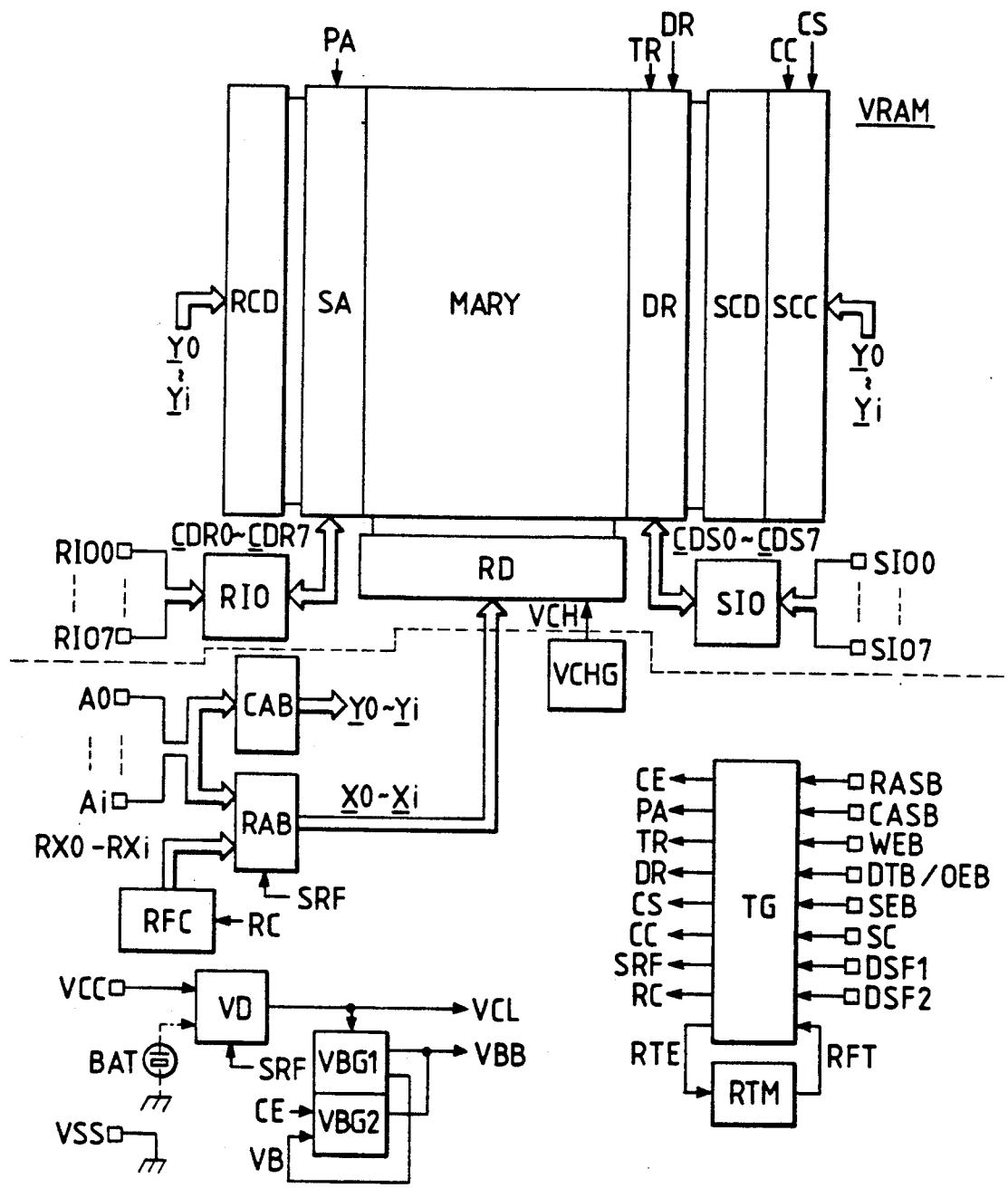
FIG. 3 is a block diagram showing one embodiment of the multi-port memory contained in the frame memory of FIG. 2.
Figure 4:
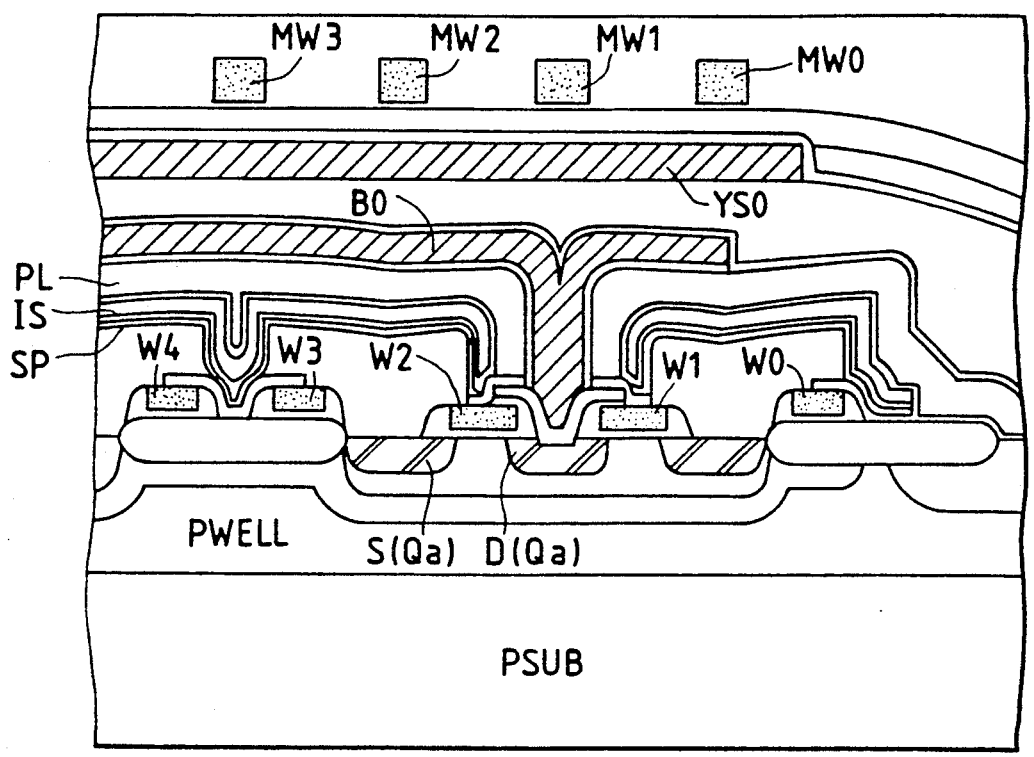
FIG. 4 is a section view showing a portion of one embodiment of a memory array contained in the multi-port memory of FIG. 3.

FIG. 3 is a block diagram showing one embodiment of the multi-port memory (VRAM) according to the present invention. On the other hand, FIG. 4 is a section showing the structure of a portion of one embodiment of a memory array MARY contained in the multi-port memory of FIG. 3. The summary of the block structure and operation of the multi-port memory of this embodiment and the features of the same will be described with reference to those figures. Incidentally, the circuit elements composing each block of FIG. 3 are formed over one semiconductor substrate of P-type single crystal silicon by the well-known CMOS integrated circuit manufacturing technology, although not especially limited thereto.

In FIG. 3, the multi-port memory of this embodiment is constructed basically of the memory array MARY which is arranged to occupy most of the surface of the semiconductor substrate. The memory array MARY includes a plurality of word lines arranged in parallel with the vertical direction of the same figure and a plurality of sets of complementary bit lines arranged in parallel with the horizontal direction, although not especially limited thereto. The intersections between those word lines and complementary bit lines are arranged in a lattice shape with a plurality of dynamic memory cells. Incidentally, the memory array MARY is shown as a single unit in FIG. 3, but, as a matter of fact, is substantially divided into eight memory mats, some of which are simultaneously activated with a predetermined regularity, as will be described hereinafter. The dashed line in FIG. 3 shows the peripheral circuit elements below the dashed line and the memory array elements above the dashed line.

Each of the dynamic memory cells composing the memory array MARY includes an address selecting MOSFET Qa and a data storing capacitor Cs, although not especially limited thereto. In a manner which is well known in the art, the drains of the address selecting MOSFETs Qa of the plural memory cells arranged in a common column of the memory array MARY are alternatively coupled in a predetermined regularity to the non-inverted or inverted signal lines of the corresponding complementary bit lines. Moreover, the gates of the address selecting MOSFETs Qa of the plural memory cells arranged in a common row are commonly coupled to the corresponding word lines. The other electrodes of the data storing capacitors Cs of all the memory cells are commonly fed with a predetermined plate voltage VPL.

In this embodiment, the dynamic memory cells composing the memory array MARY are preferably the so-called "STC (i.e., static capacitor) Cells", as shown in FIG. 4, although not especially limited thereto. Their data storing capacitor Cs is composed of a plate electrode PL of poly-silicon and a data storing electrode SP, which are formed across a predetermined insulating film IS. On the other hand, the address selecting MOSFET Qa is composed of: an N-type diffusion layer, i.e., a drain D and a source S formed in a P-type well region PWELL of a P-type semiconductor substrate PSUB; and a gate layer of poly-silicon to be also used as word lines W0 to W4 and so on. The address selecting MOSFET Qa has its drain D coupled to a non-inverted bit line B0 or the like of tungsten polycide and its gate, i.e., word lines W0 to W4 coupled to shunting main word lines MW0 to MW3. Between the non-inverted bit B0 or the like and the main word lines MW0 to MW3 or the like, there is formed a bit line selecting signal line YS0 or the like, which is made of tungsten polycide. Since the dynamic memory cells composing the memory array are thus made of the memory cells of stereoscopic structure such as the STC cells, their data holding characteristics can be improved to elongate the refresh period of the multi-port memory accordingly. As a result, the multi-port memory in the self-refresh mode can have its power consumption reduced to enhance its adaptability for the battery backup.

As shown in FIG. 3, the plural word lines composing the memory array MARY are coupled to a row address decoder RD so that they are selectively brought into a selected state, although not especially limited thereto. The row address decoder RD is fed from a row address buffer RAB with complementary internal address signals XO to Xi of (l+1) bit. Here, a non-inverted internal address signal XO and an inverted internal address signal XOB are expressed together as the complementary internal address signal XO. Moreover, the so-called "inverted signal" or "inverted signal line" to be selectively set to the low level, when effected, will be designated at a final letter B, and so on. The row address decoder is further fed from a voltage-doubling word boost circuit VCHG with a predetermined high voltage VCH. On the other hand, the row address buffer RAB is fed in a time-sharing manner with X-address signals AXO to AXi through address input terminals AO to Ai and with refresh address signals RXO to RXi from a refresh address counter RFC. The row address buffer RAB is further fed with an internal control signal SRF from a timing generator TG, and the refresh address counter RFC is fed with an internal control signal RC. Here, the high voltage VCH is set to a predetermined high level which is higher by at least the threshold voltage of the address selecting MOSFET or more than an internal supply voltage VCL, as will be described hereinafter. On the other hand, the internal control signal SRF is selectively set to the high level, when the multi-port memory is in the battery backup mode or self-refresh mode, although not especially limited thereto, and the internal control signal RC is periodically or temporarily set to the high level for a predetermined period when the multi-port memory is in the self-refresh mode.

The row address decoder RD decodes the aforementioned complementary internal address signals XO to Xi and transmits the high voltage VCH, which is fed from the voltage-doubling word boost circuit VCHG, selectively to the word line of the memory array MARY addressed by those complementary internal address signals, thereby to bring the word lines selectively into the selected state.

On the other hand, the voltage-doubling word boost circuit VCHG includes a charge pump circuit, as will be described hereinafter, to boost the internal supply voltage VCL thereby to generate the predetermined high voltage VCH which is higher by at least the threshold voltage of the address selecting MOSFET of the dynamic memory cells than that internal supply voltage VCL. In this embodiment, the boosting ratio of the voltage-doubling word boost circuit VCHG is stepwise switched in accordance with the potential of the internal supply voltage VCL. Specifically, the boosting ratio of the voltage-doubling word boost circuit VCHG is at a relatively low value when the multi-port memory is in the ordinary operation mode, so that the internal supply voltage VCL is at a relatively high potential such as +3.3 V. On the other hand, the boosting ratio is at a relatively high value when the multi-port memory is in the battery backup mode, so that the internal supply voltage VCL is at a relatively low potential such as +2.6 V. As a result, even in the battery backup mode, in which the absolute value of the internal supply voltage VCL is small, it is possible to retain a sufficient high voltage VCH, i.e., word line selecting level, thereby to stabilize the operation of the multi-port memory.

When the multi-port memory is in the ordinary operation mode so that the internal control signal SRF is at the low level, the row address buffer RAB fetches the X address signals AXO to AXi which are fed in the time-sharing manner through the address input terminals AO to Ai. On the other hand, the row address buffer RAB fetches and holds the refresh address signals RXO to RXi fed from the refresh address counter RFC, when the multi-port memory is in the self-refresh memory so that the internal control signal SRF is at the high level. on the basis of those row address signals, the row address buffer RAB generates the aforementioned complementary internal address signals XO to Xi and feeds them to the row address decoder RD.

The refresh address counter RFC performs the step-by-step operation in response to the internal control signal RC when the multi-port memory is in the self-refresh memory, although not especially limited thereto. As a result, the refresh address counter RFC generates the aforementioned refresh address signals RXO to RXi and feeds them to the row address buffer RAB.

Next, the plural complementary bit lines composing the memory array MARY are coupled at one hand to corresponding unit circuits of a sense amplifier SA and at the other to corresponding unit circuits of a data register DR, although not especially limited thereto. In this embodiment, the complementary bit lines are divided into eight groups to constitute the grouped complementary bit lines, although not especially limited thereto. The sense amplifier SA is fed with an internal control signal PA from the timing generator TG and with a bit line selecting signal from a RAM port column address decoder RDC.

The sense amplifier SA includes a plurality of unit circuits corresponding to the individual complementary bit lines of the memory array MARY, although not especially limited thereto. An example of such a sense amplifier structure (as well as of other memory structure discussed in this application) can be found in co-pending U.S. application Ser. No. 754,019, filed Sep. 3, 1991 as a continuation of U.S. application Ser. No. 496,258, which subject matter is hereby incorporated by reference. These unit circuits include: unit amplifier circuits, with which a pair of CMOS inverters are crossly connected; and a plurality of pairs of switch MOSFETs which are connected between the complementary input/output nodes of those unit amplifiers and input/output complementary common data lines CDR0 to CDR7. Of these, each unit amplifier is selectively fed with the internal supply voltage VCL and the ground potential through the P-channel and N-channel drive MOSFETs which are selectively turned on in response to the aforementioned internal control signal PA, although not especially limited thereto. On the other hand, the switch MOSFETs are divided into eight groups corresponding to the complementary bit line groups of the memory array MARY, and the eight pairs of switch MOSFETs composing each group have their gates fed commonly with the aforementioned corresponding bit line selecting signals.

The unit amplifiers composing each unit circuit of the sense amplifier SA are selectively rendered operative when the aforementioned internal control signal PA is raised to the high level so that the internal supply voltage VCL and the ground potential are fed to the paired drive MOSFETS, although not especially limited thereto. In this operating state, each unit amplifier amplifies the fine read signal, which is outputted through the corresponding complementary bit lines from the plural memory cells coupled to the selected word lines of the memory array MARY, into a binary read signal at the high or low level. On the other hand, the eight pairs of the switch MOSFETs composing each unit circuit of the sense amplifier SA are selectively and simultaneously turned on when the corresponding bit line selecting signals are selectively set to the high level.

As a result, the corresponding eight groups of the complementary bit lines of the memory array MARY are selectively connected with the random input/output complementary common data lines CDRO to CDR7.

The RAM port column address decoder RCD is fed with complementary internal address signals YO to Yi of (i+1) bits from a column address buffer CAB, and this column address buffer CAB is fed in a time sharing manner with Y address signals AYO to ARi through the address input terminals AO to Ai.

The RAM port column address decoder RCD decodes the aforementioned complementary internal address signals YO to Yi to raise the corresponding bit line selecting signals selectively to the high level. These bit line selecting signals are individually fed to the corresponding eight groups of switch MOSFETs of the sense amplifier SA, as has been described hereinbefore.

On the other hand, the column address buffer CAB responds to the not-shown timing signal to fetch and hold the Y-address signals AYO to AYi which are fed in the time sharing manner through the address input terminals AO to Ai. On the basis of the Y-address signals, moreover, the column address buffer CAB generates the complementary internal address signals YO to Yi and feeds them to the RAM port column address decoder RCD. The complementary internal address signals YO to Yi are also fed to a later-described SAM port column address counter SCC.

The random input/output complementary common data lines CDRO to CDR7 are coupled to a random input/output circuit RIO, although not especially limited thereto. The random input/output circuit RIO includes: eight write amplifiers and read amplifiers provided to correspond to the random input/output complementary common data lines CDRO to CDR7; and eight input buffers and output buffers provided to correspond to those write amplifiers and read amplifiers. Further included are an arithmetic circuit for raster operations, and a flashing light control circuit for executing the clearing operations of the stored data at the unit of word lines. Of these, the input terminals of the individual input buffers of the random input/output circuit RIO are individually coupled to corresponding random input/output terminals RIO0 to RIO7, and the output terminals of the same are individually coupled to the input terminals of the corresponding write amplifiers. These write amplifiers have their output terminals coupled individually to the corresponding complementary common data lines CDR0 to CDR7. On the other hand, the individual read amplifiers have their input terminals coupled individually to the corresponding complementary common data lines CDR0 to CDR7 and their output terminals coupled individually to the input terminals of the corresponding output buffers. The output terminals of these output buffers are individually and commonly coupled to the corresponding random input/output terminals RIO0 to RIO7.

Each write amplifier of the random input/output circuit RIO writes, when the multi-port memory is selected in the random write mode, the write data, which are fed from the random input/output terminals RIO0 to RIO7 through the corresponding input terminals, as a complementary write signal in the selected eight memory cells of the memory array MARY through the corresponding complementary common data lines CDR0 to CDR7. On the other hand, each read amplifier of the random input/output circuit RIO further amplifies, when the multi-port memory is selected in the random read mode, the read signals which are outputted from the selected eight memory cells through the corresponding common data lines CDR0 to CDR7, and transmits the amplified read signal to the outside from the corresponding output buffer through the random input/output terminals RIO0 to RIO7.

The memory array MARY, the sense amplifier SA, the row address decoder RD, the RAM port column address decoder RCD, the row address buffer RAB, the refresh address counter RFC, the column address buffer CAB and the random input/output circuit RIO thus far described constitute altogether the random access ports, i.e., the RAM ports of the multi-port memory. In these RAM ports, as has been apparent from the foregoing description, the image data writing or reading operations are executed at the unit of 8 bits and at random for the eight memory cells corresponding to the assigned address of the memory array MARY. Incidentally, when the multi-port memory is in the self-refresh mode, all the word lines in the memory array MARY are sequentially selected by the refresh address counter RFC. At this time, the stored data read out from the plural memory cells coupled to the selected word lines to the corresponding complementary bit lines are written again in the original memory cells to realize the so-called "refresh operations" by the restoring action of the sense amplifier SA.

Next, the serial access port, i.e., the SAM port of the multi-port memory of this embodiment is composed of the data register DR, a SAM port column address decoder SCD, the SAM port column address counter SCC and a serial input/output circuit SIO. Of these, the data register DR includes a plurality of unit circuits provided to correspond to the individual complementary bit lines of the memory array MARY, although not especially limited thereto. Each unit circuit includes: unit latch circuits, in which a pair of CMOS inverter circuits are crossly connected so that they are selectively and altogether activated in response to the internal control signal DR; and a plurality of pairs of data transferring switch MOSFETS which are connected between the complementary input/ output nodes of the unit latch circuits and the corresponding complementary bit lines of the memory array MARY so that they are selectively and altogether turned on in response to the internal control signal TR. Between the input/output nodes of the unit latch circuits composing the individual unit circuits of the data register DR and the serial input/output complementary common data lines CDS0 to CDS7, there are further connected a plurality of pairs of switch MOSFETS. These switch MOSFETs are divided into eight pairs of groups corresponding to the individual complementary bit line groups of the memory array MARY. The eight pairs of the switch MOSFETs constituting each group have their gates fed from the SAM port column address decoder SCD with the corresponding column selecting signals.

As a result, the data register DR fetches and latches the read data which are outputted altogether to the corresponding complementary bit lines of the memory array MARY when the multi-port memory is selected in the read transfer mode so that internal control signals TR and DR are at the high level. These read data are sequentially transmitted to the complementary common data lines CDS0 to CDS7, when the multi-port memory is brought into the serial output mode so that the column selecting signals are sequentially selected to the high level, and are serially outputted from the serial input/output circuit SIO through serial input/output terminals SIO0 to SIO7. On the other hand, the data register DR latches and fetches the write data, which are serially fed from the serial input/output circuit SIO through the complementary common data lines CDS0 to CDS7, sequentially in accordance with the column selecting signal when the multi-port memory is in the serial input mode. The plural write data fetched by the data register DR are written all at once in the plural memories which are coupled to the selected word lines of the memory array MARY, when the multi-port memory is in the write transfer mode so that the internal control signal TR is at the high level.

The SAM port column address decoder SCD is fed from the SAM port column address counter SCC with the SAM port column address signals of (i+1) bits, although not especially limited thereto. On the other hand, the column address counter SCC is fed from the aforementioned column address buffer CAB with the complementary internal address signals Y0 to Yi and from the timing generator TG with internal control signals CC and CS, although not especially limited thereto.

The SAM port column address decoder SCD decodes the aforementioned SAM port column address signals, which are fed from the SAIM port column address counter SCC, when the multi-port memory is brought into the selected state in the serial access mode, to raise the corresponding output signals, i.e., column selecting signals selectively to the high level.

On the other hand, the SAM port column address counter SCC has its counted value preset at a leading address, which is assigned by the complementary internal address signals Y0 to Yi in response to the aforementioned internal control signal CS, and is counted up in response to the internal control signal CC. The counted value of the SAM port column address counter SCC is fed as the aforementioned SAM column address signal to the SAM port column address decoder SCD.

The serial input/output complementary common data lines CDS0 to CDS7 are coupled to the serial input/ output circuit SIO, although not especially limited thereto. The serial input/output circuit SIO includes: eight serial write amplifiers and serial read amplifiers provided to correspond to the serial input/ output complementary common data lines CDS0 to CDS7; and eight serial input buffers and serial output buffers provided to correspond to those serial write amplifiers and serial read amplifiers. Of these, the individual serial input buffers have their input terminals coupled to the corresponding serial input/output terminals SIO0 to SIO7, respectively, and their output terminals coupled to the input terminals of the corresponding serial write amplifiers, respectively. The output terminals of these serial write amplifiers are coupled to the corresponding serial input/output complementary common data lines CDS0 to CDS7, respectively. The output terminals of those serial write amplifiers are coupled to the corresponding serial input/output complementary common data lines CDS0 to CDS7, respectively. On the other hand, the individual serial read amplifiers have their input terminals coupled to the corresponding serial input/output complementary common data lines CDS0 to CDS7, respectively, and their output terminals of the input terminals of the corresponding serial output buffers, respectively. The output terminals of those serial output buffers are commonly coupled to the corresponding serial input/output terminals SIO0 to SIO7, respectively.

The individual serial write amplifiers of the serial input/output circuit SIO write the write data, which are fed from the serial input/output terminals SIO0 to SIO7 through the corresponding serial input buffers, as the complementary write signals in the selected eight unit latch circuits of the data register DR through the corresponding serial input/output complementary common data lines CDS0 to CDS7 when the multi-port memory is in the serial input mode. When the multi-port memory is in the serial output mode, on the other hand, the individual serial read amplifiers of the serial input/output circuit SIO further amplify the read data, which are outputted from the selected eight unit latch circuits of the data register DR through the corresponding serial input/output complementary common data lines CDS0 to CDS7, and transmit them out serially through the corresponding serial output buffers and serial input/output terminals SIO0 to SIO7.

The timing generator TG is fed through external terminals RASB, CASB, WEB, DTB (OEB), SEB, DSF1 and DSF2, respectively, with start control signals such as the row address strobe signal RASB, the column address strobe signal CASB, the write enable signal WEB, the data transfer control signal DTB (or output enable signal OEB), the serial output enable signal SEB and the special function signals DSF1 and DSF2, although not especially limited thereto. The timing generator TG is further fed with a serial clock signal SC through an external terminal SC and with a refresh timing signal RFT from a refresh timer RTM. Here, the refresh timing signal RFT is raised to the high level, as will be described hereinafter, when a predetermined time elapses after an internal control signal RTE has been set to the low level, to set the refresh period in the self-refresh mode in the multi-port memory. On the basis of the start control signals, serial clock signal SC and refresh timing signal RFT, the timing generator TG generates the aforementioned various internal control signals and feeds them to the individual circuits of the multi-port memory.

Incidentally, the refresh timer circuit RTM of this embodiment is of the so-called "diffusion layer leakage type", in which the time period from the low level of the internal control signal RTE to the high level of the refresh timing signal RFT corresponds to the amount of leakage, i.e., the data holding characteristics of the memory cells, as will be described hereinafter. As a result, the refresh period in the self-refresh mode can be elongated in accordance with the data holding characteristics to reduce the operating current of the multi-port memories in the self-refresh mode.

The multi-port memories of this embodiment are further equipped with a voltage dropping circuit VD and substrate potential generators VBG1 (i.e., first substrate potential generator) and VBG2 (i.e., second substrate potential generator). Of these, the voltage dropping circuit VD is fed with the DC supply voltage VCC through the external terminal VCC and with the aforementioned internal control signal SRF from the timing generator TG. On the other hand, the substrate potential generators VBG1 and VBG2 are fed with the internal supply voltage VCL from the voltage dropping circuit VD. The substrate potential generator VBG2 is further fed with an internal control signal CE from the timing generator TG and with an internal control signal VB from the substrate potential generator VBG1. Here, the internal control signal SRF is selectively set to the high level, when the multi-port memory is in the self-refresh mode, and the internal control signal CE is selectively set to the high level when the multi-port memory is selected in any operating mode, as has been described hereinbefore. Moreover, the internal control signal VB is selectively set to the high level, when the absolute value of a substrate potential VBB is equal to or lower than a predetermined level as will be described hereinafter. Incidentally, FIG. 3 is shown as if the DC power were directly supplied from the battery BAT to the voltage dropping circuit VD. As a matter of fact, however, the power supply POW of the personal computer PC switches the DC power supply of AC 100 V and the DC power supply.

On the basis of the DC supply voltage VCC fed from the power supply POW through the external terminal VCC, the voltage dropping circuit VD generates the internal supply voltage VCL at a relatively stable potential and feeds it to the individual portions of the multi-port memory. As has been described hereinbefore, the central voltage of the DC supply voltage VCC is set to +5 V, for example, in the ordinary operating mode, in which the multi-port memory is not backed up by the battery, and to +2.6 V, for example, when in the battery backup operation. On the other hand, the central voltage of the internal supply voltage VCL is fixed at about +3.3 V, when the potential of the DC supply voltage VCC exceeds +3.3 V, and is set to the same potential as that of the DC supply voltage VCC when the potential of the DC supply voltage VCC is below +3.3 V. In other words, the potential of the internal supply voltage VCL is fixed at about +3.3 V when the multi-port memory is in the ordinary operation mode so that the central voltage of the DC supply voltage VCC is at +5 V, and is also set to about +2.6 V when the multi-port memory is in the battery backup mode so that the potential of the DC supply voltage VCC is at +2.6 V.

Figure 15:
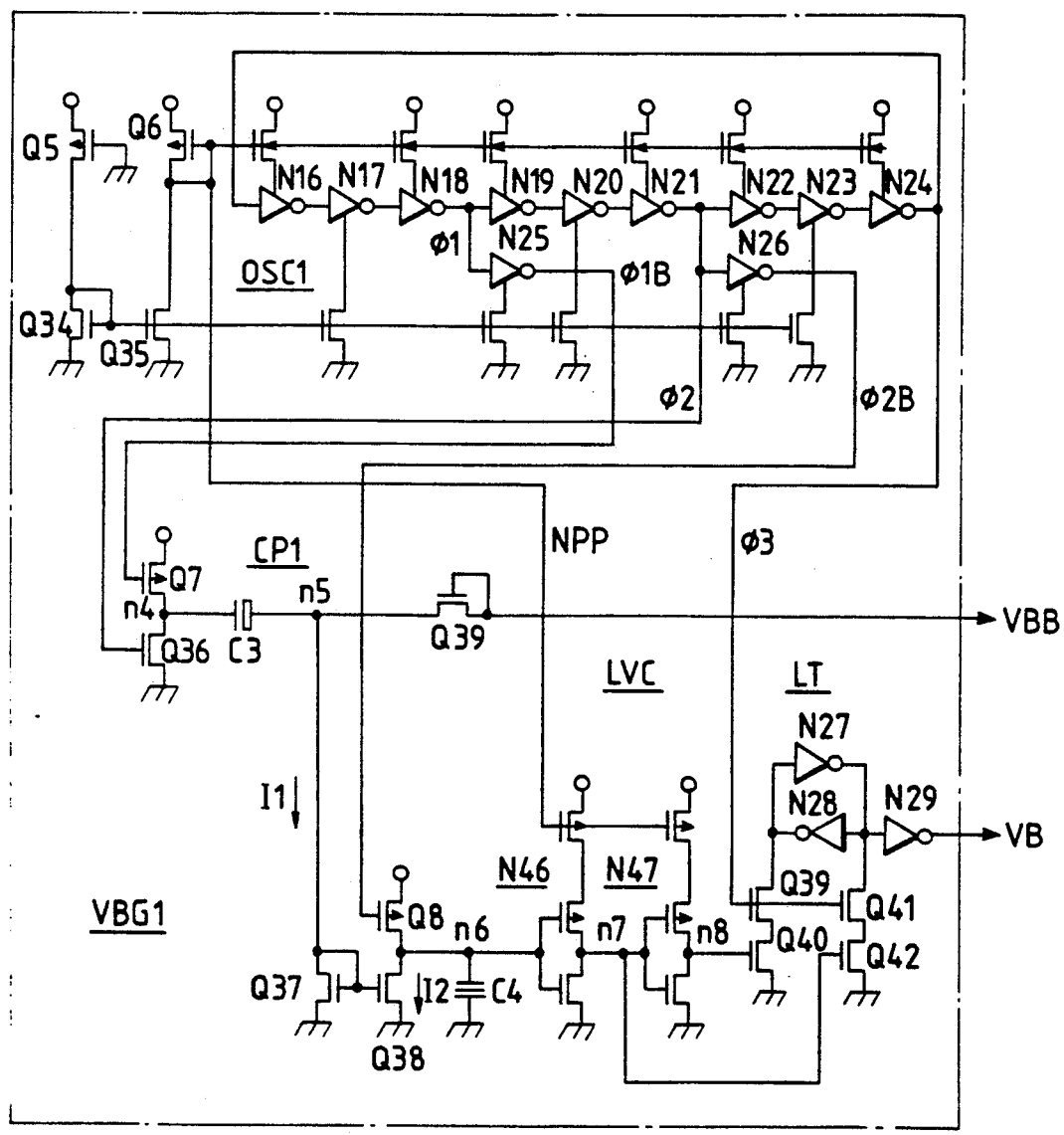
FIG. 15 is a circuit diagram showing one embodiment of the first substrate potential generator and the level detecting circuit contained in the multi-port memory of FIG. 3.

The substrate potential generator VBGL has a relatively low current supplying ability, as will be described hereinafter, to generate the predetermined negative substrate potential VBB when it is steadily in the operating state. The substrate potential generator VBGL includes a level detecting circuit LVC (as shown in FIG. 15) for discriminating that the absolute value of the substrate potential VBB reaches a predetermined level. On the other hand, the substrate potential generator VBG2 has a relatively high current supplying ability and is selectively brought into the operating state, when the multi-port memory is selected, to raise the internal control signal CE to the high level or when the absolute value of the substrate potential VBB fails to reach the predetermined level so that the output signal of the level detecting circuit LVC, i.e., the internal control signal VB, is set to the high level. The substrate potential VBB to be generated by the substrate potential generators VBGL and VBG2 is fed to the P-type PSUB which is formed with the multi-port memory. As a result, the threshold voltage of the MOSFETs (i.e., Metal Oxide Semiconductor Field Effect Transistors, which term herein will generally be used for the insulated gate type field effect transistors) composing the multi-port memory is controlled to stabilize the operations.

In this embodiment, the level detecting circuit LVC monitors the charge current with respect to the charge pump capacity of the substrate potential generator VBG1, without any steady level discrimination current, to discriminate that the absolute value of the substrate potential VBB has reached a predetermined level. As a result, the operating current of the multi-port memory in the self-refresh mode is reduced to enhance the adaptability to the battery backup of the multi-port memory.

Figure 6:
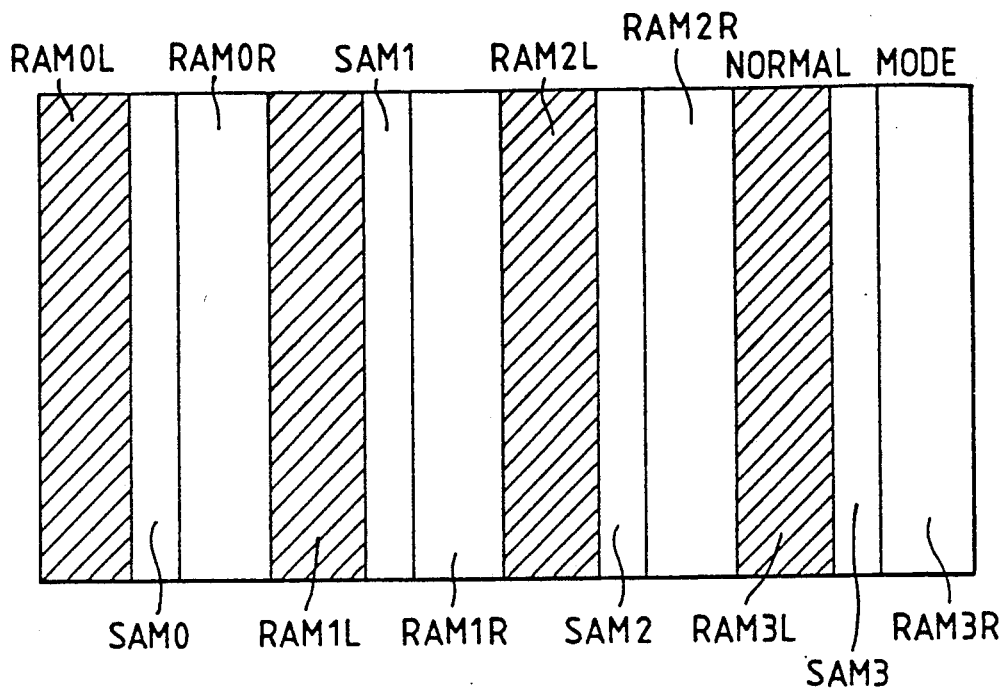
FIG. 6 is a memory mat selecting conceptional diagram in the ordinary mode of the memory array contained in the multi-port memory of FIG. 3.
Figure 7:
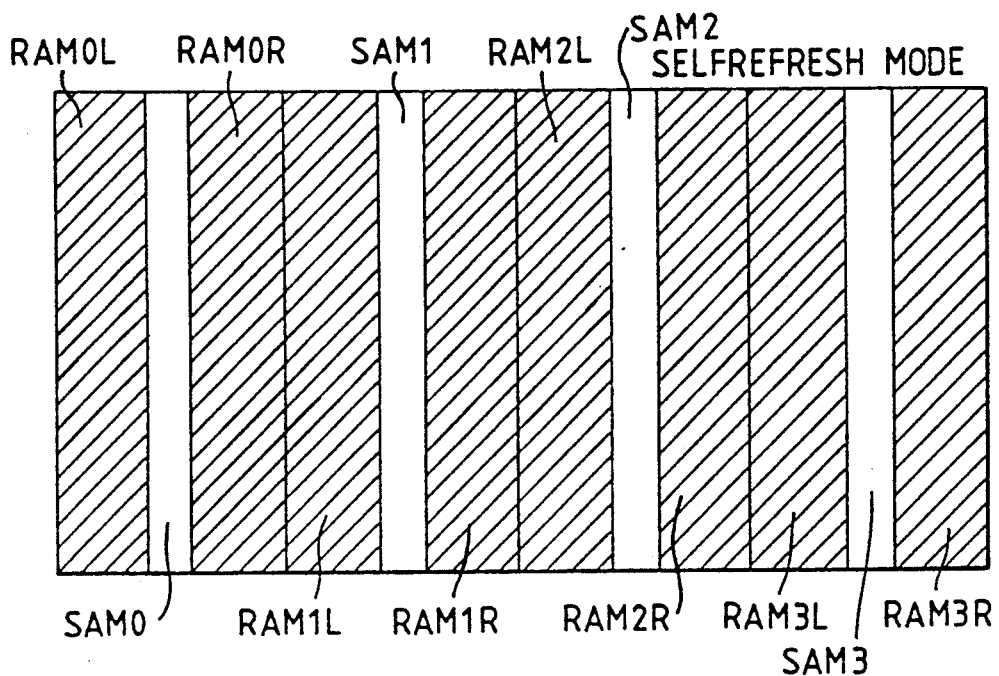
FIG. 7 is a memory mat selecting conceptional diagram in the self-refresh mode of the memory array contained in the multi-port memory of FIG. 3.
Figure 8:
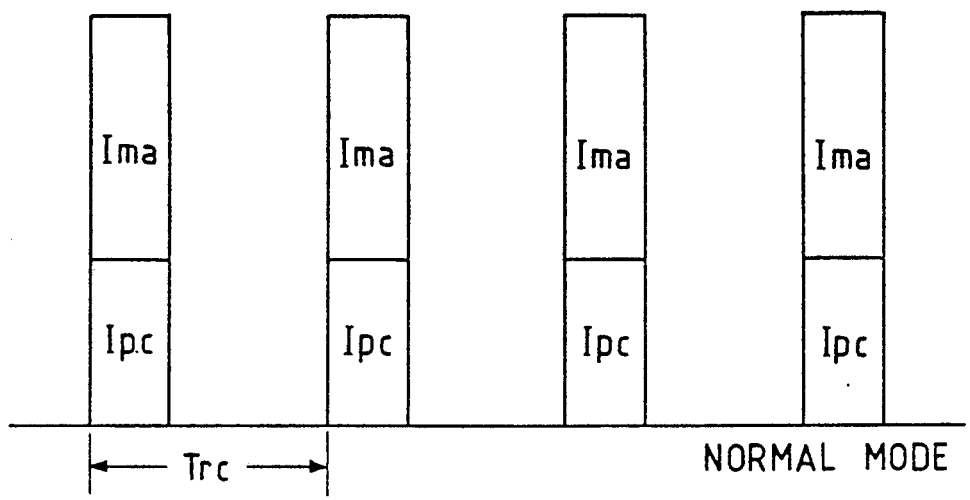
FIG. 8 is a power distribution diagram in the ordinary mode of the multi-port memory of FIG. 3.
Figure 9:
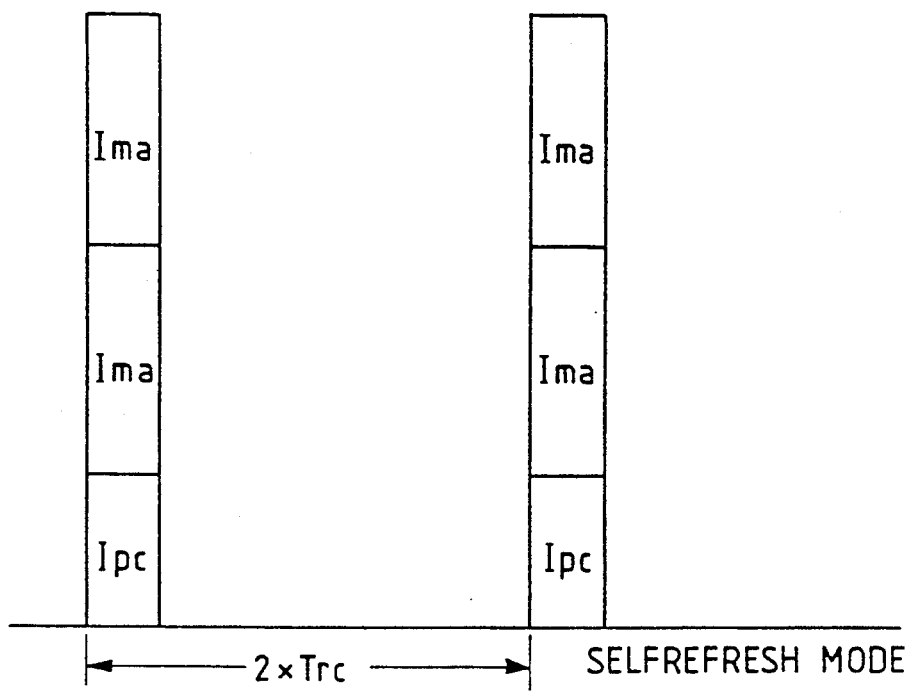
FIG. 9 is a power distribution diagram in the self-refresh diagram of the multi-port memory of FIG. 3.

3. Summary of Self-Refresh Mode of the Multi-Port Memory and Features of the Same FIG. 3 is a timing chart showing one embodiment of the self-refresh mode setting cycle of the multi-port memory of FIG. 3. On the other hand, FIGS. 6 and 7 are memory mat selecting concept diagrams showing the multi-port memory of FIG. 3 in the ordinary mode and in the self-refresh mode, respectively, and FIGS. 8 and 9 are power distribution diagrams in the ordinary mode and in the self-refresh mode, respectively. With reference to these various Figures, the summary of the multi-port memory of this embodiment in the self-refresh mode and the features of the same will be described in the following.

Figure 5:
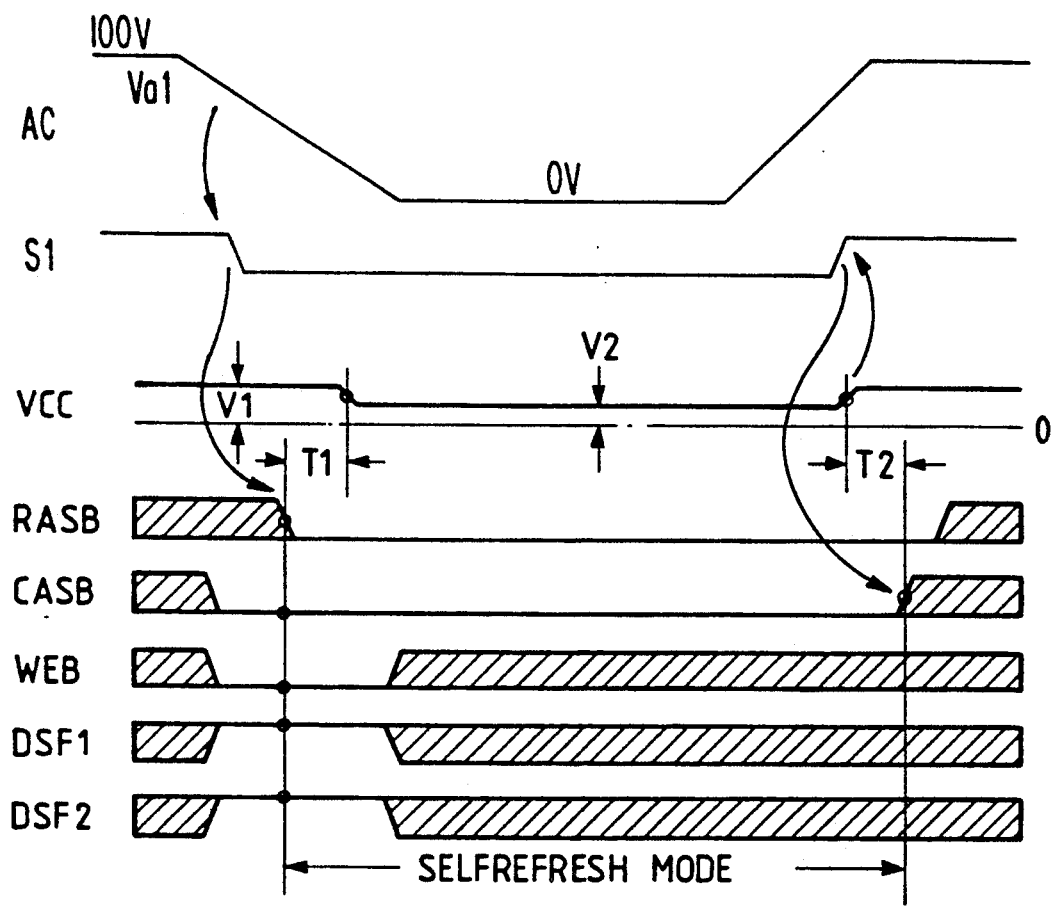
FIG. 5 is a timing chart showing one embodiment of the self-refresh mode setting cycle of the multi-port memory of FIG. 3.

In FIG. 5, the multi-port memory of this embodiment is brought into the self-refresh mode, i.e., the battery backup mode, when a row address strobe signal RASB is set to the low level after a column address strobe signal CASB and a write enable signal WEB are set to the low level, and after special function signals DSF1 and DSF2 are set to the high level, although not especially limited thereto. The DC supply voltage VCC to be fed from the power supply POW of the personal computer PC to the multi-port memory has to be switched from a voltage V1 such as +5 V to a voltage such as +2.6 V after lapse of a predetermined time T1 from the fall of the row address strobe signal RASB, and has to be returned to the original voltage V1 prior to a predetermined time T2 or more from the rise of the column address strobe signal CASB, although not especially limited thereto.

FIG. 5 also shows how the signals RASB, CASB and WEB are generated when the main AC power is switched off. The personal computer PC has a power voltage monitor means (not shown in the drawing) for detecting the voltage of an AC power or Vcc. The power voltage monitor means can be provided in the power supply POW. When the main switch is turned off, the AC voltage drops down to 0 V from 100 V. The power voltage monitor means detects that the AC voltage is down to Val and outputs a signal S1 to the central processing unit CPU. The central processing unit CPU instruct the graphic controller GC to set signals RASB, CASB and WEB in predetermined levels for placing the memory VRAM in self-refresh mode.

When the main switch is turned on, the AC voltage rises to 100 V from 0 V and, consequently, Vcc is switched from a voltage V2 to a voltage V1. The power voltage monitor means detects that the Vcc is switched to V1 and outputs signal S1 to the central processing unit CPU. The central processing unit CPU instructs the graphic controller GC and then sets signals RASB, CASB and WEB in predetermined levels for returning the memory VRAM in normal mode.

In this embodiment, the memory array MARY of the multi-port memory is divided, as shown in FIGS. 6 and 7 into substantially eight memory mats, i.e., RAM ports RAMOL to RAM3L and RAMOR to RAM3R, although not especially limited thereto. Between the paired RAM ports RAMOL and RAMOR to RAM3L and RAM3R, there are interposed the corresponding SAM ports SAMO to SAM3. In the ordinary operation mode without the battery backup, as hatched in FIG. 6, all the four memory mats, i.e., the RAM ports RAMOL to RAM3L or RAMOR to RAM3R are simultaneously activated so that a total of four word lines addressed in each RAM port are selected into the selected state. At this time, the refresh operation is executed by using a RAS only refresh cycle, for example, so that the series refresh operations relating to all the word lines are repeated with a refresh period Trc, as shown in FIG. 8. Moreover, the memory array corresponding to the four activated RAM ports is fed with a total array current of Ima, and its direct peripheral circuit is fed with a total peripheral circuit current of Ipc. Referring to FIG. 3, the total array current Ima will be consumed by the elements above the dashed line, while the total peripheral circuit current will be consumed by the elements below the dashed line.

In the self-refresh mode, on the other hand, the eight memory mats, i.e., all the RAM ports RAMOL to RAM3L and RAMOR to RAM3R in the multi-port memory are activated all at once so that the total of eight word lines addressed at each RAM port are selected into the selected state. At this time, the refresh operation is executed in a self-control manner by the refresh timer circuit RTM and the refresh address counter RFC so that a series of refresh operations relating to all the word lines are repeated with a refresh period of $2 \times Trc$, i.e., twice as long as that of the aforementioned ordinary mode, as shown in FIG. 9. As a result, the memory array corresponding to the activated eight RAM ports is fed with a total array current of $2 \times Ima$ so that its direct peripheral circuit is fed with a total peripheral circuit current of Ipc which is substantially the same value as in the aforementioned ordinary mode. In other words, the necessary value of Ipc will be substantially the same even through twice as many memory cells are refreshed. As a result, the synthetic power consumption of the multi-port memory in the self-refresh mode is reduced to an extent corresponding to the peripheral circuit current Ipc so that the adaptability of the multi-port memory to the battery backup is enhanced. It is to be noted that it is possible to use the higher peak current in the self-refresh mode because, at that time, there is no output from the system and no display provided. During normal mode operation, such a high peak current could cause problems for the output and display.

4. Specific Structures of Individual Portions of Multi-Port Memory and Features of the Same

4.1. Refresh Timer Circuit

Figure 10:
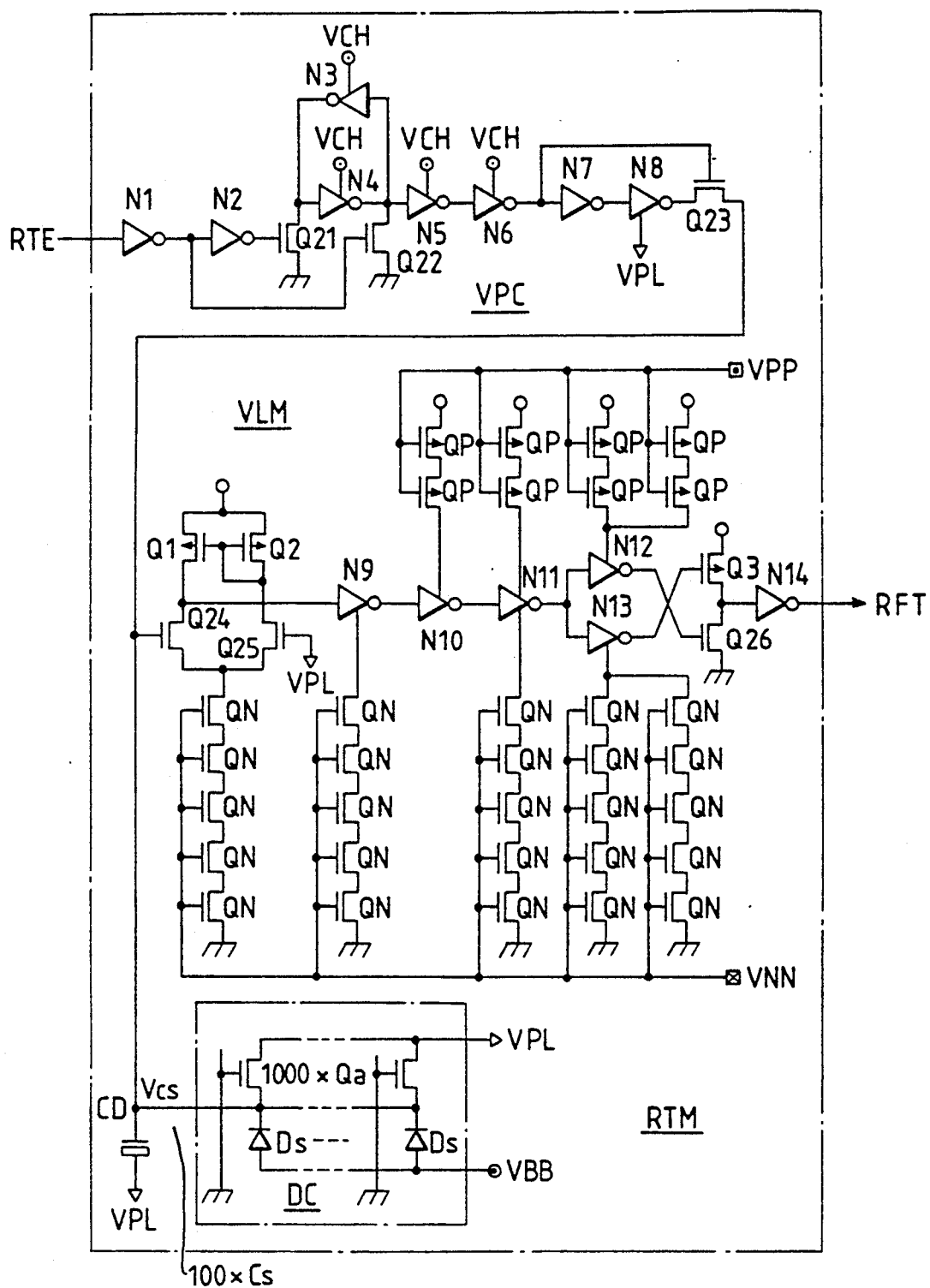
FIG. 10 is a circuit diagram showing one embodiment of the refresh timer circuit contained in the multi-port memory of FIG. 3.
Figure 11:
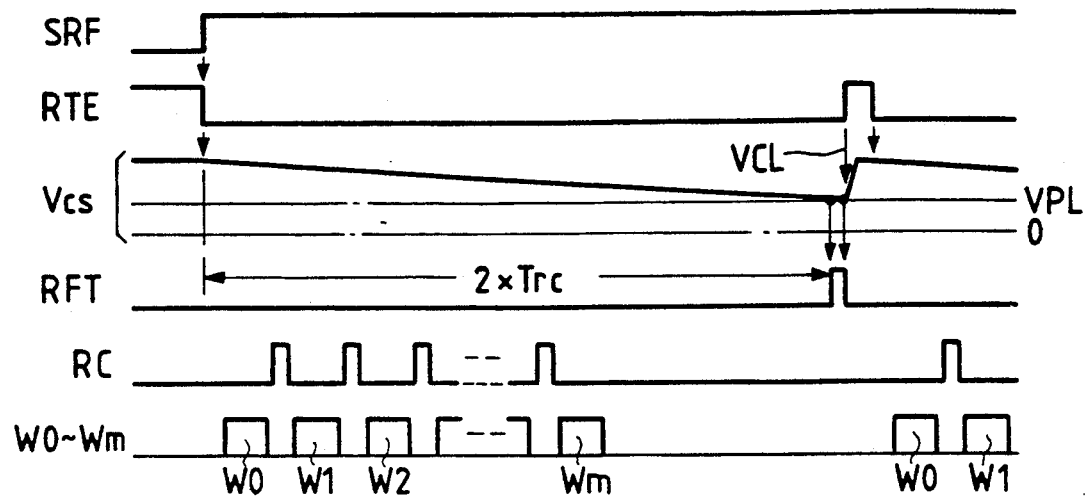
FIG. 11 is a signal waveform chart showing one embodiment of the refresh timer circuit of FIG. 10.

FIG. 10 is a circuit diagram showing one embodiment of the refresh timer circuit RTM contained in the multi-port memory of FIG. 3, and FIG. 11 is a waveform chart showing the signals of the embodiment. With reference to these Figures, the detail of the specific structure and operation of the refresh timer circuit RTM of this embodiment and the features of the same will be described in the following. Incidentally, in the following circuit diagrams, the MOSFETs indicated by arrows at their channel (or back gate) portions are of P-type MOSFETS, which are discriminated from N-channel MOSFETs having no arrow.

In FIG. 10, the refresh timer circuit RTM of this embodiment includes: a capacitor CD having a static capacitance about one hundred times as high as that of the data storing capacitor Cs of the dynamic memory cells composing the aforementioned memory array MARY; and a precharge circuit VPC, a plurality of dummy cells DC and a level decision circuit Vim, all of which have their output terminal or input terminal commonly coupled to one electrode of the aforementioned capacitor CD, i.e., an internal node Vcs, although not especially limited thereto. The dummy cell DC is used in conjunction with the capacitor CD to provide a reference voltage level Vcs which can represent the leakage current variation caused by temperature in the actual memory array. This can then be used to set an optimum refresh rate. The other electrode of the capacitor CD iB fed with a plate voltage VPL which is given a level half as high as that of the internal supply voltage VCL. On the other hand, the precharge circuit VPC includes an inverter N1 made receptive of an internal control signal RTE from the timing circuit TG, and an inverter N2 made receptive of an output signal of the inverter N1, although not especially limited thereto. Here, the internal control signal RTE is set to the high level, as shown in FIG. 11, when the multi-port memory is in the ordinary operation mode, so that the internal control signal SRF is at the low level. The signal RTE is set to the low level when the multi-port memory is in the self-refresh mode so that the internal control signal SRF is at the high level, although not especially limited thereto. Moreover, the internal control signal SRF is temporarily returned to the high level when the output signal of the refresh timer circuit RTM, i.e., the refresh timing signal RFT, is at the high level.

The precharge circuit VPC further includes a latch circuit, in which inverters N3 and N4 are crossly connected. This latch circuit has its inverted input/output node coupled through an N-channel MOSFET Q21 to the ground potential of the circuit, and its non-inverted input/output node coupled through an N-channel MOSFET Q22 to the ground potential of the circuit. The MOSFET Q21 has its gate fed with the output signal of the aforementioned inverter N2, and the MOSFET Q22 has its gate fed with the output signal of the inverter Ni. As a result, the latch circuit composed of the inverters N3 and N4 is brought into the set state when the aforementioned internal control signal RTE is at the high level, and into the reset state when the same is at the low level. Incidentally, in this embodiment, the inverters N3 and N4 exemplify the high-potential side supply voltage by the high voltage VCH which is generated by the voltage-doubling word boost circuit VCHG. The latch circuit composed of the inverters N3 and N4 has its non-inverted input/output node coupled through four inverters N5 to N8 to the drain of an N-channel MOSFET Q23, although not especially limited thereto. This MOSFET Q23 has its source coupled to one electrode of the aforementioned capacitor CD, i.e., the internal node Vcs. The gate of the MOSFET Q23 is fed with the output signal of the inverter N6. Incidentally, the inverters N5 and N6 are fed with the high voltage VCH as its high-potential side supply voltage. On the other hand, the inverter N8 is fed with the internal supply voltage VCL as its high-potential side supply voltage and with the plate voltage VPL as its low-potential side supply voltage.

As a result, the MOSFET Q23 is selectively turned on when the non-inverted output signal of the latch circuit composed of the inverters N3 and N4 is at the high level, namely, when the internal control signal RTE is at the high level, to precharge the aforementioned internal node Vcs. Then, this internal node Vcs is not influenced by the threshold voltage of the MOSFET Q23, but is sufficiently precharged to the level of the internal supply voltage VCL because the high level of the high-potential side supply voltage of the inverter N6, i.e., the gate voltage of the MOSFET Q23, is at the high voltage VCL. When the internal control signal RTE is at the low level so that the non-inverted output signal of the latch circuit composed of the inverters N3 and N4 is set to the low level, the MOSFET Q23 is turned off to interrupt the precharge of the internal node Vcs. As a result, the level of the internal node Vcs, i.e., the charge of the capacitor CD, is allowed to leak through one thousand address selecting MOSFETs Qa of the later-described dummy cells DC, thereby gradually dropping, as shown in FIG. 11. As has been described hereinbefore, the other electrode of the capacitor CD is fed with the plate voltage VPL. When the internal control signal RTE is at the low level so that the MOSFET Q23 is turned off, the drain potential of the MOSFET Q23 is at the low-potential side supply voltage of the inverter N8, i.e., the plate voltage VPL. Thus, the amount of the charge of the capacitor CD to leak through the MOSFET Q23 is negligibly low. As a result, the accuracy of the refresh timer circuit RTM is enhanced to match the data holding characteristics of the memory cells better.

In the embodiment shown, one thousand dummy cells DC are provided, each including an address selecting MOSFET Qa and a diode Ds. The MOSFETs Qa are coupled substantially in parallel, although not especially limited thereto. These address selecting MOSFETs Qa are made to correspond to the unselected states of the address selecting MOSFETs Qa of one thousand dynamic memory cells composing the memory array MARY. As a result, the individual address selecting MOSFETs Qa of each of the dummy cells DC have their drains coupled commonly to the precharge level of the bit lines, i.e., the plate voltage VPL, and their gates coupled commonly to the unselected level of the word lines, i.e., the ground potential of the circuit. The sources of the individual address selecting MOSFETs Qa of the dummy cells DC are commonly coupled to one electrode of the capacitor CD, i.e., the internal node Vcs, and to the P-type semiconductor substrate PSUB, i.e., the substrate potential VBB, through the corresponding parasitic diodes Ds.

Here, the reason why one thousand dummy cells DC are provided is to average the diffusion layer leakage due to the address selecting MOSFETs Qa. The reason why the capacitors having the static capacity of only one hundred data storing capacitors cs is provided for one thousand dummy cells DC is to set the refresh period for the worst case considering that the static capacity of the data storing capacitors Cs exhibits a dispersion of about one decade. These values are for purposes of example only. The ratio of the value of the capacitance of CD and the number of dummy cells DC can be changed depending on the leakage current characteristics of the actual memory cells being used.

The level decision circuit VLM includes a differential circuit, which is centered by a pair of N-type differential MOSFETs Q24 and Q25, although not especially limited thereto. The MOSFET Q24 has its gate coupled to the aforementioned internal node Vcs, and the MOSFET Q25 has its gate fed with the aforementioned plate voltage VPL. Moreover, the MOSFETs Q24 and Q24 have their drains coupled to the internal supply voltage through a pair of P-type MOSFETs Q1 and Q2 having a current mirror connection and acting as active loads. Q24 and Q25 also have their commonly coupled sources coupled to the ground potential of the circuit through five N-channel MOSFETs QN having a series connection. Each of these N-channel MOSFETs QN is caused to act as a constant current source for a relatively low operating current when its gate is fed with a predetermined constant voltage VNN. As a result, the differential circuit centered by the differential MOSFETs Q24 and Q25 functions as a current switch circuit for logical threshold of the plate voltage VPL and acts as a voltage comparator. As a result, the output signal of the differential circuit, i.e., the level of the MOSFET Q24, is set to a low level, such as the ground potential of the circuit, when the potential of the internal node Vcs is higher than the plate voltage VPL, and is set to a high level, such as the internal supply voltage VCL, when the potential of the internal node Vcs is lower than the plate voltage VPL. It goes without saying that the differential circuit composed of the MOSFETs Q24 and Q25 has a low operating current because the constant current source is composed of the serially connected five MOSFETs QN.

The output signal of the aforementioned differential circuit, i.e., the drain potential of the MOSFET Q24, is gradually amplified by serially connected inverters N9 to N11, N12 and N13, and is then transmitted to a P-channel MOSFET Q3 and an N-channel MOSFET Q26. After having passed through an inverter N14, moreover, the transmitted output signal is fed as the output signal of the refresh timer circuit RTM, i.e., the refresh timing signal RFT, to the timing generator TG. The high-potential side power supply node and the low-potential power supply node of the inverters N9 to N13 are likewise individually coupled to the internal supply voltage VCL or the ground potential through two serially connected P-channel MOSFETs QP or five N-channel MOSFETs QN because of the necessity for reducing the power and adjusting the level.

When the multi-port memory is in the ordinary operation mode without the battery backup so that the internal control signal SRF is at the low level, as shown in FIG. 11, the internal control signal RTE is set to the high level, and the internal node Vcs is precharged to the high level such as the internal supply voltage VCL. At this time, the output signal of the differential circuit centered by the MOSFETs Q24 and Q25 is set to the low level, and the output signal of the refresh timer circuit RTM, i.e., the refresh timing signal RFT is also set to the low level.

Next, when the multi-port memory is in the self-refresh mode so that the internal control signal SRF is at the high level, a series of refresh operations relating to word lines W0 to Wm are at first executed in the multi-port memory sequentially in response to the internal control signal RC, although not especially limited thereto. Since, moreover, the internal control signal RTE is at the low level, the level of the internal node Vcs is gradually dropped as the stored charge of the capacitor CD is leaked through the one thousand address selecting MOSFETs Qa composing the one thousand dummy cells DC. Then, the refresh timing signal RFT is set to the high level, when the level of the internal node Vcs becomes lower than the plate voltage VPL, so that the internal control signal RTE is responsively returned to the high level. As a result, the internal node Vcs is precharged again to return the refresh timing signal RFT to the low level, too. After that, the aforementioned operations are repeated by returning the internal control signal RTE to the low level so that the refresh timing signal RFT is periodically generated with a predetermined period of $2 \times Tre$.

As has been described hereinbefore, the dummy cells DC include one thousand address selecting MOSFETs Qa connected substantially in parallel, and are connected to a static capacity corresponding to that of the data storing capacitor Cs of one hundred dynamic memory cells. Moreover, the process fluctuations of those dummy cells DC and the capacitors Cs exhibit similar tendencies of those of the dynamic cells composing the memory array MARY. Nevertheless, the time period from the precharge of the internal node Vcs with the internal supply voltage VCL to the drop to the plate voltage VPL corresponds to the data storage time in the worst case of the dynamic cells composing the memory array MARY, and can warrant the process fluctuations of the data storage time. As a result, the refresh period in the self-refresh mode can be effectively set, without providing a margin more than necessary, to a longer value while warranting the data storing characteristics of the memory cells. Thus, the low power consumption of the multi-port memory is promoted to enhance the adaptability to the battery backup.

4.2. Voltage-Doubling Word Boost Circuit

Figure 12:
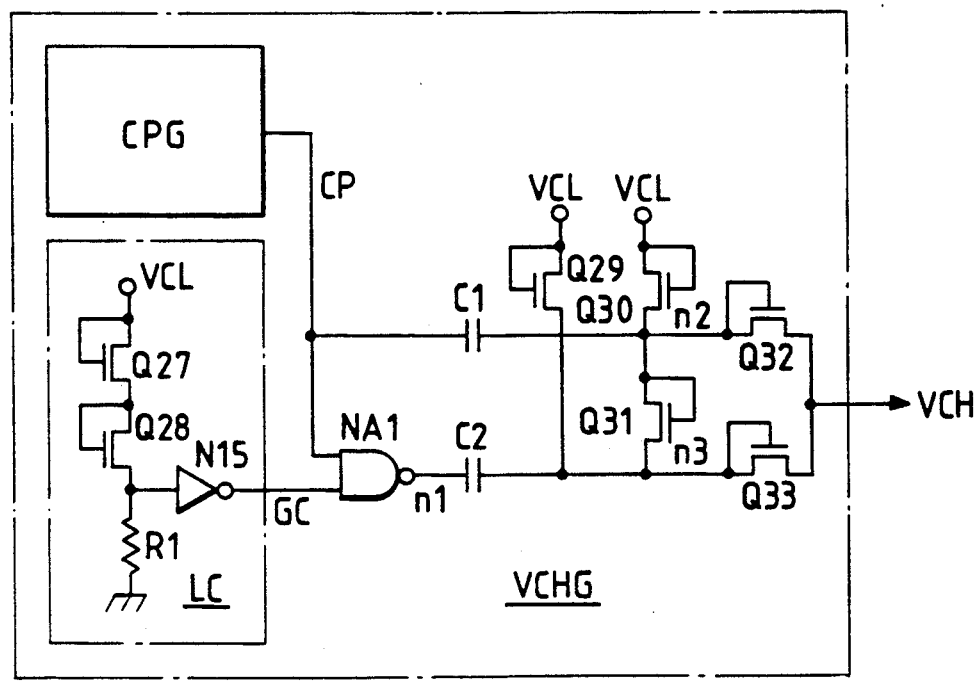
FIG. 12 is a circuit diagram showing one embodiment of the voltage-doubling word boost circuit contained in the multi-port memory of FIG. 3.
Figure 13:
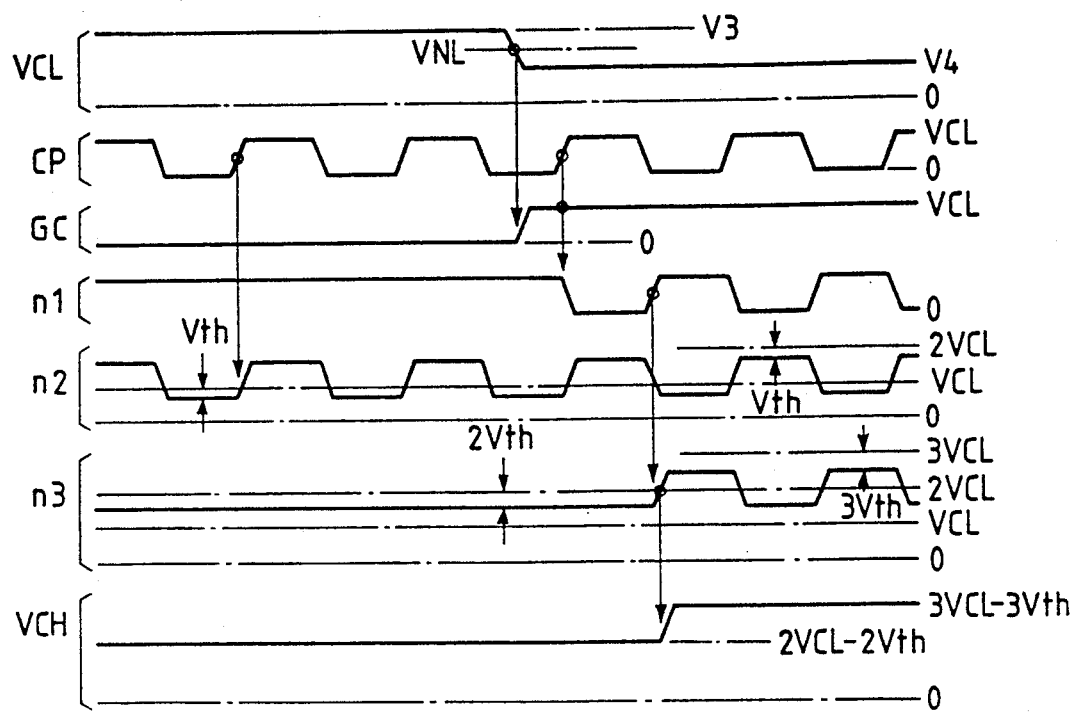
FIG. 13 is a signal waveform diagram showing one embodiment of the voltage-doubling word boost circuit of FIG. 12.
Figure 14:
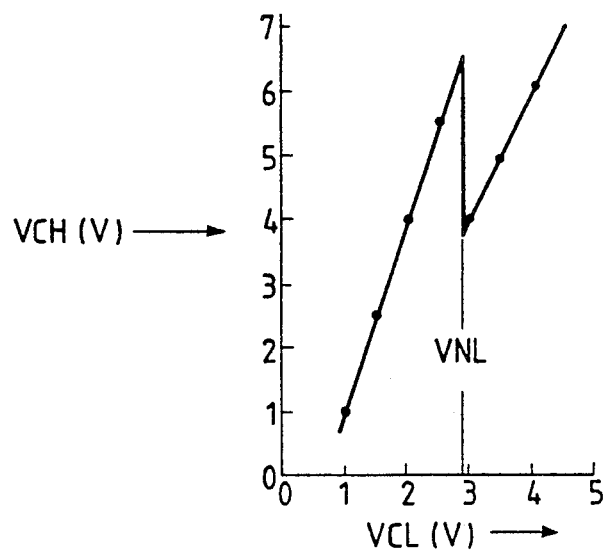
FIG. 14 is an output characteristic diagram showing one embodiment of the voltage-doubling word boost circuit of FIG. 12.

FIG. 12 is a circuit diagram showing one embodiment of the voltage-doubling word boost circuit VCHG included in the multi-port memory of FIG. 3. Moreover, FIG. 13 is a waveform chart of the signals of one embodiment of the voltage-doubling word boost circuit VCHG of FIG. 12, and FIG. 14 is a diagram showing the output characteristics of the same. With reference to these Figures, the details of the specific construction and operations of the voltage-doubling word boost circuit VCHG and the features of the same will be described in the following.

In FIG. 12, the voltage-doubling word boost circuit VCHG of this embodiment includes a clock pulse generator CPG for generating clock pulses CP and a level discriminating circuit LC for monitoring the level of the internal supply voltage VCL, although not especially limited thereto. Of these, the clock pulse generator CPG is constructed of a ring oscillator, for example, although not especially limited thereto, for generating the predetermined clock signals CP steadily, as shown in FIG. 13.

On the other hand, the level discriminating circuit LC is composed of N-channel MOSFETs Q27 and Q28 and a resistor R1 connected in series between the internal supply voltage VCL and the ground potential. These MOSFETs Q27 and Q28 have their gates and drains coupled to each other to have a diode connection. Moreover, the MOSFET Q28 has its source coupled to the input terminal of an inverter N15 having a predetermined logical threshold level V1t, the output signal of which is used as the output signal GC of the level discriminating circuit LC. As a result, the output signal GC of the level discriminating circuit LC is selectively raised to the high level on condition that the potential VCL of the internal supply voltage is made lower than a predetermined discrimination voltage VNL defined by the following formula:

$$VNL = V1t + 2 \times Vth.$$

As has been described hereinbefore, the potential of the internal supply voltage VCL is set at +3.3 V, in the ordinary mode without the battery backup of the multi-port memory, and at +2.6 V in the self-refresh mode. Nevertheless, the aforementioned discrimination voltage VNL is set to about +2.9 V between those levels, for example.

The voltage-doubling word boost circuit VCHG further includes two charge pump capacitors C1 and C2, although not especially limited thereto, of these, the capacitor C1 has its one electrode fed with the aforementioned clock signal CP, although not especially limited thereto, and its other electrode, i.e., an internal node n2, coupled to the internal supply voltage VCL through an N-channel MOSFET Q30 in a diode connection and further to the output node of the voltage-doubling word boost circuit VCHG, i.e., the high supply voltage VCH, through an N-channel MOSFET Q32, likewise in a diode connection. On the other hand, one electrode of the capacitor C2, i.e., an internal node n1, is fed with the output signal of a 4NAND gate NA1, although not especially limited thereto. This NAND gate NA1 has its one input terminal fed with the aforementioned clock signal CP and its other input terminal fed with the output signal GC of the aforementioned level discriminating circuit LC. The other electrode of the capacitor C2. i.e., an internal node n3, is coupled to the internal supply voltage VCL through an N-channel MOSFET Q29 in a diode connection. The internal node n3 is further coupled to the aforementioned high supply voltage VCH through an N-channel MOSFET Q33, likewise in a diode connection, and further to the internal node n2 through another N-channel MOSFET Q31 in a diode connection.

When the multi-port memory is in the ordinary operation mode so that the internal supply voltage VCL is set to a voltage V3 such as +3.3 V, the output signal GC of the level discriminating circuit LC is set to the low level, as shown in FIG. 13, so that the output signal of the NAND gate NA1, i.e., the internal node n1, is fixed at the high level. If, at this time, the clock signal CP is at the low level, the internal node n2 is precharged to a level of (VCL−Vth) as it is fed with the internal supply voltage VCL through the MOSFET Q30. If the clock signal CP is raised to the high level, the level of the internal node n2 is boosted to the level of (2VCL−Vth) by the charge pumping action of the capacitor C1. This level is transmitted through the MOSFET Q32 to the high supply voltage VCH to change the potential to (2VCL−2Vth). Incidentally, the level of the internal node n3 is boosted to the level of (2VCL−2Vth), as the level of the internal node n2 is boosted, but is held because of absence of a discharge passage. As has been described hereinbefore, the high voltage VCH is fed as the word line selecting level to the row address decoder RD. If the threshold voltage Vth of the N-channel MOSFETs including the address selecting MOSFETs Qa of the dynamic memory cells is at 1 V, the potential of the high voltage VCH is expressed by the following formula:

$$VCH = 2VCL - 2Vth$$
$$= 4.6 \text{ V}.$$

As is well known in the art, the word line selecting level VWL is required to satisfy the following relation:

$$VWL \geq VCL + Vth$$
$$\geq 4.3 \text{ V}.$$

Nevertheless, the potential of the aforementioned high voltage VCH in the ordinary mode satisfies the above-specified requisite.

If, on the other hand, the multi-port memory is in the self-refresh mode so that the internal supply voltage VCL is set to a voltage V4 such as +2.6 V, the output signal GC of the level discriminating circuit LC is raised to the high level, as shown in FIG. 13. As a result, the output signal of the NAND gate NA1, i.e., the internal node n1, is the inverted signal of the clock signal CP. If, at this time, the clock signal CP is at the low level, the internal node n2 is likewise precharged to the value of (VCL−Vth) and is boosted to the value of (2VCL−Vth) as the clock signal CP is set to the high level. Nevertheless, the internal node n3 is precharged to the level of (2VCL−2Vth), while the internal node n1 is fixed at the high level, as has been described hereinbefore, and is precharged to the level of (2VCL−2Vth) because the internal node n2 is boosted to the level of (2VCL−Vth) while the internal node n1 is set at first to the low level. As a result, at the instant when the internal node n1 is subsequently changed to the high level, the level of the internal node n2 is boosted to the level of (3VCL−2Vth) by the charge pumping action of the capacitor 2. This level is transmitted through the MOSFET Q33 to the high supply voltage VCH to set the potential of the same to the level of (3VCL −3Vth).

In the self-refresh mode of the multi-port memory in which the internal supply voltage VCL is at +2.6 V, it is assumed that the potential of the high voltage VCH remains at the level of (2VCL−2Vth) in the ordinary mode. Then, the level of the high voltage VCH is expressed by the following formula if the threshold voltage Vth of the N-channel MOSFETs is exemplified by 1 V:

$$VCH = 2VCL - 2Vth$$
$$= 3.2 \text{ V}.$$

Thus, the level of the high voltage VCH is lower than the necessary word line selecting level, as expressed by the following formula:

$$VWL = VCL + Vth$$
$$= 3.6 \text{ V}.$$

In the multi-port memory of this embodiment, as has been described hereinbefore, the high voltage VCH is boosted to the level of (3VCL−3Vth) by the charge pump action of the capacitor C2 so that the multi-port memory of this embodiment takes the following potential satisfying the requisite as the word line selecting level:

$$VCH = 3VCL - 3Vth$$
$$= 4.8 \text{ V}.$$

Specifically in the multi-port memory of this embodiment, as shown in FIG. 14, the boosting ratio of the voltage-doubling word boost circuit VCHG is stepwise switched across the potential of the internal supply voltage VCL, i.e., the discrimination voltage VNL, so that the high voltage VCH. i.e. , the word line selecting level, is stepwise switched. As a result, a sufficient word line selecting level can be retained even in case the multi-port memory is in the battery backup mode so that the internal supply voltage VCL is as low as +2.6 V, for example. As a result, the multi-port memory has its operation stabilized and its adaptability enhanced to the battery backup.

4.3. Substrate Potential Generator

Figure 16:
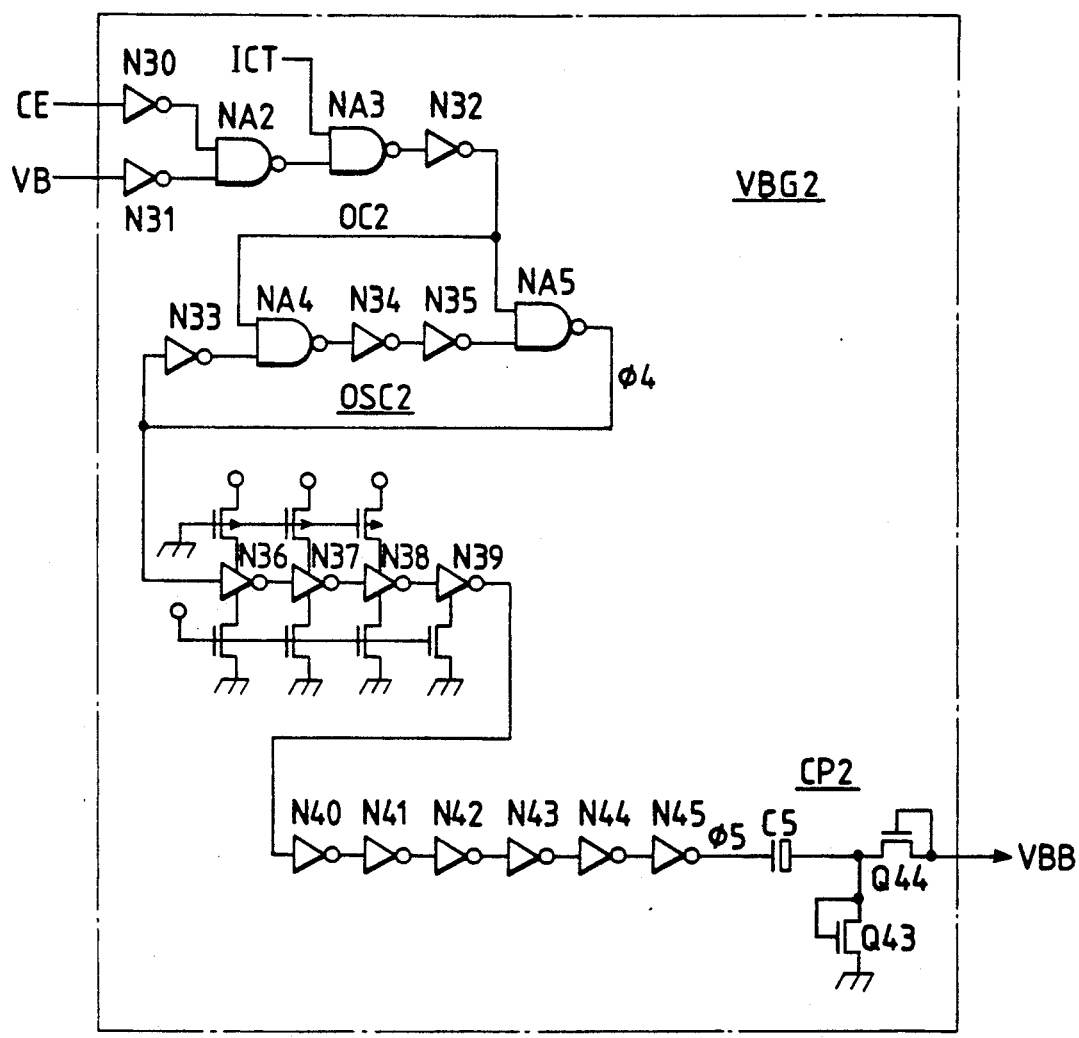
FIG. 16 is a circuit diagram showing one embodiment of the second substrate potential generator contained in the multi-port memory contained in the multi-port memory of FIG. 3.
Figure 17:
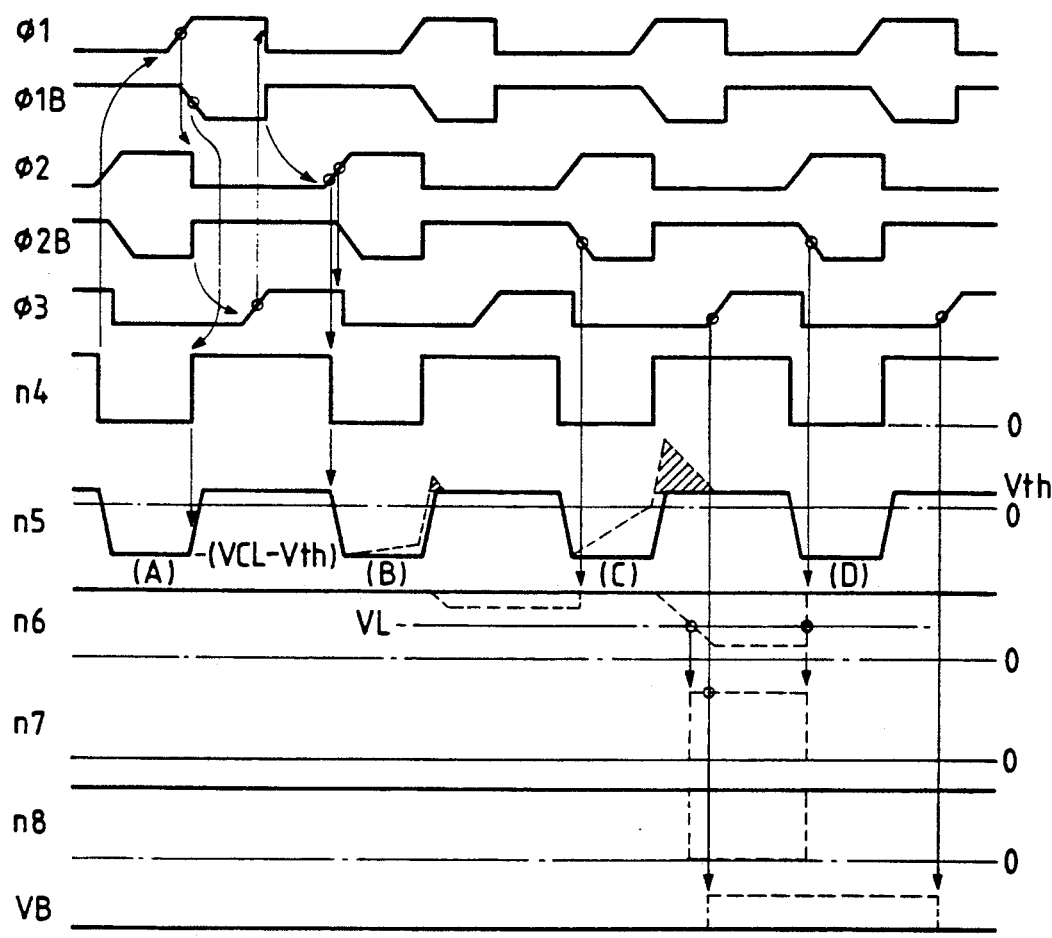
FIG. 17 is a signal waveform diagram showing one embodiment of the first substrate potential generator and the level detecting circuit shown in FIG. 15.

FIGS. 15 and 16 are respectively individual circuit diagrams showing one embodiment each of the substrate potential generators VBGL (i.e., the first substrate potential generator) and VBG2 (i.e., the second substrate potential generator) included in the multi-port memory of FIG. 3. On the other hand, FIG. 17 is a waveform chart showing the signals of the embodiment of the substrate potential generator VBG1 of FIG. 15. With reference to these Figures, the details of the specific structures and operations of the substrate potential generators VBG1 and VBG2 and the features of the same will be described in the following.

In FIG. 15, the substrate potential generator VBG1 includes a oscillating circuit OSC1, a charge pump circuit CP1 and a level detecting circuit LVC, although not especially limited thereto. Of these, the oscillating circuit OSC1 is composed of nine inverters N16 to N24 coupled in a ring shape, although not especially limited thereto. The inverters N16, N18, N19, N21, N22 and N24 are fed with a relatively low operating current through a P-channel drive MOSFET connected in a current mirror configuration with respect to a P-channel MOSFET Q6, so that their output signal rises are selectively delayed. On the other hand, the inverters N17, N20 and N23 are fed with a relatively low operating current through an N-channel drive MOSFET connected in a current mirror configuration with respect to an N-channel MOSFET Q34, so that their output signal falls are selectively delayed. As a result, the inverters N16 to N24 act as a one ring oscillator in a steadily operating state to generate pulse signals having a frequency as relatively low as about 30 KHz.

The output signal of the inverter N18 composing the oscillating circuit OSC1. i.e., a pulse signal $\phi$ 1 is fed to the inverter N19 at the subsequent step and further to an inverter N25. The output signal of this inverter N25 is fed as an inverted pulse signal $\phi$ 1B to the gate of a P-channel MOSFET Q7 composing the charge pump circuit CP1. The inverter N18 is selectively delayed in the rise of its output signal, as has been described hereinbefore. On the other hand, the inverter N25 is fed with a relatively low operating current through an N-channel type drive MOSFET in a current mirror configuration with the N-channel MOSFET Q34 so that the fall of its output signal is selectively delayed. As a result, the pulse signal $\phi$ 1 has its rise selectively delayed, as shown in FIG. 17, so that the inverted pulse signal $\phi$ 1B has its falling change delayed selectively.

Likewise, the output signal of the inverter N21 composing the oscillating circuit OSC1, i.e., a pulse signal $\phi$ 2, is fed to the subsequent inverter N22 and further to the gate of an N-channel MOSFET Q36 composing the charge pump circuit CP1 and to an inverter N26. The output signal of the inverter N26 is fed as an inverted pulse signal $\phi$ 2B to the gate of a P-channel MOSFET Q8 composing the level detecting circuit LVC. The inverter N21 is selectively delayed in the rise of its output signal, as has been described hereinbefore. On the other hand, the inverter N26 is fed with a relatively low operating current through an N-channel type drive MOSFET in a current mirror configuration with respect to the N-channel MOSFET Q34 so that it is selectively delayed in the fall of its output signal. As a result, the pulse signal $\phi$ 2 is selectively delayed in its rising change, as shown in FIG. 17, so that the inverted signal $\phi$ 2B is selectively delayed in its falling change.

On the other hand, the output signal of the inverter N24 composing the oscillating circuit OSC1, i.e., a pulse signal $\phi$ 3, is fed back to the initial stage inverter N16 and fed to the gates of N-channel MOSFETs Q39 and Q41 composing the latch circuit LT of the level detecting circuit LVC. The inverter N24 is selectively delayed in the rising change of its output signal, as has been described hereinbefore. As a result, the pulse signal $\phi$ 3 is selectively delayed in its rising change, as shown in FIG. 17.

Next, the charge pump circuit CP1 of the substrate potential generator VBGL includes a charge pump capacitor having a relatively low static capacitance (e.g., 25 pF), i.e., a capacitor C3, although not especially limited thereto. One electrode of the capacitor C3, i.e., an internal node n4, is coupled through the P-channel MOSFET Q7 to the internal supply voltage VCL and further through the N-channel MOSFET Q36 to the ground potential of the circuit. The other electrode of the capacitor C3, i.e., an internal node n5, is coupled to the ground potential of the circuit through an N-channel MOSFET Q37 in a diode connection, and further to the substrate potential supply point VBB through an N-channel MOSFET Q39 likewise in a diode connection. As a result, the internal node n4 of the charge pump circuit CP1 is selectively set to the high level such as the internal supply voltage VCL when the inverted pulse signal $\phi$ 1B is set to the low level to turn on the MOSFET Q7, as shown in FIG. 17, and is selectively set to the low level such as the ground potential of the circuit when the pulse signal $\phi$ 2 is set to the high level to turn on the MOSFET Q36.

When the internal node n4 is at the high level, the other electrode of the capacitor C3, i.e., the internal node n5, is boosted to the high level such as the internal supply voltage VCL by the charge pumping action of the capacitor C3. Since, however, the internal node n5 is coupled to the ground potential of the circuit through the MOSFET Q37 in the diode connection, as has been described hereinbefore, its potential is clamped at the threshold voltage Vth of the MOSFET Q37, as shown in FIG. 17.

When the internal node n4 is set to the low level, on the other hand, the internal node n5 is dropped by the absolute value VCL of the internal supply voltage to a negative potential such as $-(VCL-Vth)$. In case, at this time, the potential of the substrate potential VBB is higher by the threshold voltage Vth or more of the MOSFET Q39 than the potential of the internal node n5, the MOSFET Q39 is turned on. As a result, the potential of the internal node n5 gradually rises in accordance with the difference between the levels of the internal node n5 and the substrate potential VBB, as indicated by dotted lines in cycles B and C of FIG. 17. Specifically, the high potential of the substrate potential VBB means that the negative charge stored in the substrate potential supply point VBB has been released by a substrate leakage or the like, and the corresponding rise of the potential of the internal node n5 is due to the fact that the negative charge stored in the capacitor C3 is supplied to the substrate potential supply point VBB. It goes without saying that a not-shown smooth capacitance having a relatively high static capacitance is coupled to the substrate potential supply point VBB. Therefore, the potential rise of the substrate potential VBB could not be said to be sufficient even if the charge stored in the capacitor C3 were wholly released to the substrate potential supply point VBB.

When the internal node n4 is then returned to the high level, the internal node n5 once rises by the absolute value VCL of the internal supply voltage from the raised potential according to the amount of the released negative charge until it takes a potential corresponding to the threshold voltage Vth of the MOSFET Q37. At this time, the MOSFET Q37 is temporarily turned on, because the potential of the internal node n5 is made higher than the threshold voltage Vth, to feed a charge current I1 for compensating the released negative charge of the capacitor C3. It goes without saying that the value of the charge current I1 corresponds to the difference between the levels of the amount of the released charge of the capacitor C3, i.e., the low level of the internal node n5, and the substrate potential VBB. When the potential of the internal node n5 is at the aforementioned level of $-(VCL-Vth)$, the MOSFET Q39 is left OFF in case the potential of the substrate potential VBB is not higher by the threshold voltage Vth of the MOSFET Q39 than that of the internal node n5. As a result, the charge stored in the capacitor C3 is not released so that the internal node n5 holds the aforementioned negative potential, as exemplified in cycles A and D of FIG. 17. Thus, even if the internal node n4 is then returned to the high level, the potential of the internal node n5 is only returned to the potential corresponding to the threshold voltage Vth of the MOSFET Q37 to feed none of the charge current I1 for compensating the charge release of the capacitor C3.

Following the above-described operation, similar operations are repeated in the charge pump circuit CP1 so that the substrate potential VBB is controlled to a negative potential of about $-(VCL-2Vth)$. Since, however, the capacitor C3 is designed to have a relatively low static capacity, as has been described hereinbefore, the charge pump circuit CP1, i.e., the substrate potential generator VBG1, is given a relatively low current supplying ability (e.g., approximately 100 μA, although not limited thereto). As a result, the substrate potential generator VBG1 is low in power consumption and effective for compensating a light substrate leakage in the unselected state of the multi-port memory, but the current supplying ability is too low to restore the potential of the substrate potential VBB abruptly or to suppress the drop of the substrate potential VBB promptly at the time of selecting the multi-port memory. However, the multi-port memory of this embodiment is additionally given the substrate potential generator VBG2 having a relatively large current supplying ability and adapted to be selectively brought into the operative state, if necessary.

The level detecting circuit LVC of the substrate potential generator VBG1 includes an N-channel MOSFET Q38 connected in the current mirror manner with the MOSFET Q37, although not especially limited thereto. The MOSFET Q38 has its drain coupled to the internal supply voltage VCL through the P-channel type precharge MOSFET Q8 and further to one electrode of a level detecting capacitor, i.e., a capacitor C4, namely, an internal node n6. The other electrode of the capacitor C4 is coupled to the ground potential of the circuit. On the other hand, the MOSFET Q8 has its gate fed with the inverted pulse signal φ2B from the oscillating circuit OSC1. As a result, the capacitor C4, i.e., the internal node n6, is selectively precharged to the high level such as the internal supply voltage VCL, when the inverted pulse signal φ2B is at the low level so that the MOSFET Q8 is turned on, as shown in FIG. 17. Moreover, the capacitor C4 is selectively discharged when the stored charge of the capacitor C3 of the charge pump circuit CP1 is released so that a discharge current I2 is fed through the MOSFET Q38. As has been described hereinbefore, the MOSFET Q38 is connected in a current mirror configuration with the MOSFET Q37, and this MOSFET Q37 feeds the charge current I1 proportional to the amount of discharge of the stored charge of the capacitor C3. As a result, the discharge current I2 to be fed through the MOSFET Q38 takes a value proportional to the aforementioned charge current I1 so that the potential of the internal node n6 drops in accordance with the amount of discharge of the stored charge of the capacitor C3, that is, the difference between the potential of the internal node n5 and the level of the substrate potential VBB.

The internal node n6 is further coupled to an input terminal of an inverter N46 acting as level decision means, although not especially limited thereto. This inverter N46 has its operating current restricted, because it is fed through a P-channel type drive MOSFET connected in a current mirror configuration with the P-channel MOSFET Q6, so that it is given a predetermined logical threshold level VL. In this embodiment, the logical threshold level VL of the inverter N46 is set to correspond to the level difference between the absolute value VCL of the internal supply voltage and the absolute value VBB of the substrate Potential, although not especially limited thereto, and is designed such that the product of the conductance ratio of the MOSFETs Q37 and Q38 and the static capacity ratio of the capacitors C4 and C3 is smaller than 1.

The output signal of the inverter N46 is fed as an internal signal n7 to the gate of an N-channel MOSFET Q42 composing a latch circuit LT. The signal is inverted by an inverter N47 and is then fed as an internal signal n8 to the gate of an N-channel MOSFET Q40 composing the latch circuit LT. This latch circuit LT includes a pair of inverters N27 and N28 which are crossly connected with each other, although not especially limited thereto. Of these, the input terminal of the inverter N27, i.e., the output terminal of the inverter N28, is coupled to the ground potential of the circuit through N-channel MOSFETs Q39 and Q40. On the other hand, the output terminal of the inverter N27, i.e., the input terminal of the inverter N28, is coupled to the input terminal of an inverter N29 and further through the N-channel MOSFETs Q41 and Q42 to the ground potential of the circuit. The MOSFETs Q39 and Q41 have their gates fed commonly with the pulse signal φ3 from the oscillating circuit OSC1, as has been described hereinbefore. The output signal of the inverter N29 is fed as the internal control signal VB to the substrate potential generator VBG2.

As indicated by the cycles A and D of FIG. 17, the potential of the internal node n6 is left at the high level such as the internal supply voltage VCL, in case the stored charge of the capacitor C3 is not released nor flows the charge current I1, i.e., the discharge current I2. As indicated by the cycle B of FIG. 17, moreover, the potential of the internal node n6 will not drop to the logical threshold level VL of the inverter N46 even in case the amount of discharge of the stored charge of the capacitor C3 is so low that the integrated value of the charge current I1, i.e., the discharge current I2, is relatively low. In either case, therefore, the output signal of the inverter N46, i.e., the internal signal n7, is left at the low level so that the internal control signal VB is also left at the low level.

If, on the other hand, the amount of release of the stored charge of the capacitor C3 increases so that the integrated value of the charge current I1, i.e., the discharge current I2, increases, as indicated by the cycle C of FIG. 17, and the potential of the internal node n6 becomes lower than the logical threshold level VL of the inverter N46. Thus, the output signal of the inverter N46, i.e., the internal signal n7, changes to the high level so that its inverted signal, i.e., the internal signal n8, changes to the low level. As a result, the latch circuit LT is inverted at the falling edge of the pulse signal $\phi$ 3 so that the internal control signal VB is raised to the high level.

In short, the level discriminating operations of the substrate potential VBB by the level detecting circuit LVC of this embodiment are realized by monitoring the flow of the charge current I1, i.e., the discharge current I2, for compensating the charge pump capacitance, i.e., the charge release of the capacitor C3, without requiring the steady operating current, when the level difference between the internal node n5 and the substrate potential feeding point VBB exceeds a predetermined amount. As a result, the low power consumption of the multi-port memory is further promoted to enhance the adaptability to the battery backup.

When the internal control signal VB is at the high level, the substrate potential generator VBG2 of the multi-port memory having a relatively high current feeding ability is brought into the operative state to restore the potential of the substrate potential VBB promptly. In this embodiment, the charge pump capacity composing the charge pump circuit CP2 of the substrate potential generator VBG2, i.e., the capacitor C5, is given a relatively high static capacity (e.g., approximately 100 pF, although not limited thereto), as will be described hereinafter, so that a pulse signal $\phi$ 5 to be fed to that charge pump circuit CP2 is given a relatively high frequency such as 3 Mega Hz. As a result, the restoring operations of the potential of the substrate potential VBB by the substrate potential generator VBG2 are speeded up so that they are ended within one cycle of complementary pulse signals $\phi$ 1 and $\phi$ 3.

Next, the substrate potential generator VBG2 includes the oscillating circuit OSC2 and the charge pump circuit CP2, as shown in FIG. 16, although not especially limited thereto. Of these, the oscillating circuit OSC2 includes three inverters N33, N34 and N35 and two NAND gates NA4 and NA5 coupled in a ring shape, although not especially limited thereto. The other input terminals of the NAND gates NA4 and NA5 are commonly fed with the inverted signal of the output signal of a NAND gate NA3 by the inverter N32, i.e, an internal control signal OC2. The NAND gate NA3 has its one input terminal fed with a test control signal ICT and its other input terminal fed with the output signal of an NAND gate NA2, although not especially limited thereto. This NAND gate NA2 has its one input terminal fed with the inverted signal of the internal control signal CE by an inverter N30 and its other input terminal fed with the inverted signal of the aforementioned internal control signal VB by an inverter N31. As a result, the internal control signal OC2 is selectively raised to the high level on condition that the test control signal ICT is at the high level and that either of the internal control signal CE or VB is at the high level. As has been described hereinbefore, the internal control signal CE is set to the high level at a predetermined timing when the multi-port memory is brought into the selected state, and the internal control signal VB is selectively raised to the high level when the absolute value of the substrate potential VBB is at a predetermined level or less. As a result, the oscillating circuit OSC2 is selectively brought into the selected state to generate a pulse signal $\phi$ 4 having a relatively high frequency such as about 3 Mega Hz, when the multi-port memory is brought into the selected state or when the absolute value of the substrate potential VBB is at a predetermined level or less. The pulse signal $\phi$ 4 has its driving ability gradually increased through totally ten inverters N36 to N45 connected in series, although not especially limited thereto, and is then fed as the output signal of the oscillating circuit OSC2, i.e., a pulse signal $\phi$ 5, to one electrode of the charge pump capacitance composing a charge pump circuit CP2, i.e., a capacitor C5.

The charge pump circuit CP2 is composed basically of the charge pump capacitor having a relatively high static capacity, i.e., the capacitor CS, although not especially limited thereto. The other terminal of the capacitor C5 is coupled to the ground potential of the circuit through an N-channel MOSFET Q43 in a diode connection and to the substrate potential supply point VBB through an N-channel MOSFET Q44 likewise in a diode connection. As a result, the charge pump circuit CP2 performs a charge pumping action like that of the charge pump circuit CP1 of the aforementioned substrate potential generator VBGL to generate the substrate potential VBB or a predetermined potential such as $-(V_{CL} - 2V_{th})$. As has been described hereinbefore, the capacitor CS is designed to have a relatively high static capacity so that the pulse signal $\phi$ 5 is given a relatively high frequency such as about 3 Mega Hz. Thus, the charge pump circuit CP2, i.e., the substrate potential generator VBG2, is given a relatively high current supplying ability of a few mA. As a result, the reduction of the level of the substrate potential VBB, which might otherwise be caused when the multi-port memory is brought into the selected state, is suppressed, and drop in the level of the substrate potential VBB is promptly restored.

As has been described in connection with the foregoing embodiments, the following operations and effects can be achieved by applying the present invention to a semiconductor memory device such as the multi-port memory contained in a frame memory of a personal computer or the like.

(1) Since the dynamic memory cells composing a memory array of the multi-port memory are those having the stereoscopic structure such as the STC cells, the data holding time of the memory cells can be improved to elongate the refresh period accordingly. As a result, there is attained an effect that the power consumption of the multi-port memory can be reduced.

(2) The high voltage to be selectively transmitted as the selected level to the word lines of the multi-port memory or the like to be brought into the selected state is generated by the voltage-doubling word boost circuit which has its boosting ratio switched stepwise in accordance with the potential of the internal supply voltage. Thus, there is attained an effect that a sufficient word line selecting level can be retained even in case the absolute value of the internal supply voltage is low.

(3) The substrate potential generating circuit for generating the substrate potential of the multi-port memory or the like is constructed of: the first substrate potential generator having a relatively low current supplying ability and adapted to be steadily brought into the operative state; and the second substrate potential generator having a relatively high current supplying ability and adapted to be selectively brought into the operative state when the multi-port memory is brought into the selective state or when the output signal of the level detector indicates that additional current is necessary to maintain proper substrate potential. At the same time, the discriminations of the substrate potential by the level detecting circuit are accomplished by monitoring the charge current of the charge pump capacitor. As a result, there is attained an effect that the power consumption of the multi-port memory can be reduced by reducing the operating current necessary for discriminating the level of the substrate potential and the operating current of the substrate potential generator at the unselected time.

(4) At the battery backup time, the multi-port memory is in the self-refresh mode so that the number of memory mats to be simultaneously activated in the self-refresh mode is made larger than that of the ordinary mode. As a result, there is attained an effect that the operating current of the multi-port memory in the self-refresh mode can be reduced.

(5) The refresh timer circuit for setting the refresh period in the self-refresh mode is a diffusion layer leakage type timer circuit which includes: a plurality of dummy cells connected substantially in parallel; a capacitor having a static capacitance about one tenth as high as the total static capacitance of a plurality of data storing capacitors provided to correspond to dynamic memory cells in the same number as that of the aforementioned dummy cells. Since the refresh period can be elongated according to the data holding characteristics of the memory cells, there is attained an effect that the power consumption of the multi-port memory can be accordingly reduced.

(6) Thanks to the foregoing effects (1) to (5), there is attained an effect that the adaptability of the multi-port memory to the battery backup can be enhanced to realize a multi-port memory capable of being backed up by the battery.

(7) Thanks to the foregoing effects (1) to (6), there is attained an effect that the resume function of a personal computer including the multi-port memory can be realized without restricting the bit rate of image data and the function as the frame memory.

Although our invention has been specifically described in connection with the embodiments thereof, it should not be limited to the aforementioned embodiments but can naturally be modified in various manners without departing the gist thereof. Some examples of modifications will be discussed below.

As shown in FIG. 1, for example, the personal computer PC can use a liquid crystal display device or the like in place of the CRT display device. Moreover, a serial IO controller or a DMA controller may be coupled to the system bus S-BUS, or the system structure of the personal computer PC may take a variety of modes of embodiments. In FIG. 2, the number of the multi-port memories VRAM disposed in the frame memory FM is arbitrary, and a variety of embodiments of the block structure of the frame memory FM could be conceived.

In FIG. 3, the multi-port memory need not include the voltage-dropping circuit VD. In this modification, the discriminations of the supply voltage by the level discriminating circuit LC of the voltage-doubling word boost circuit VCHG and the boosting operations of the high voltage VCH are accomplished on the basis of the DC supply voltage VCC. The combination and name of the start control signal are not restricted by this embodiment. The multi-port memory can input or output the stored data at the unit of 4 bits or 16 bits. The SAM port of the multi-port memory may be equipped with two data registers to be alternately used and may be equipped with a pointer of a shift register or the like in place of the SAM port column address counter SCC.

In FIG. 4, the dynamic memory cells composing the memory array MARY can be exemplified by other types of memory cells in place of the STC cells including other types of stereoscopic cells. Moreover, the specific device structures of the memory array MARY and the memory cells are not restricted by this embodiment. In FIG. 5, the setting cycle for setting the multi-port memory into the self-refresh mode may be realized by holding a predetermined start control signal, for example, at a low level for a predetermined time or more. Moreover, the specific value of the DC supply voltage VCC in the ordinary mode and in the self-refresh mode can be arbitrarily set.

In FIGS. 6 and 7, the memory array can be divided into an arbitrary number of memory mats, and the number of the memory mats to be simultaneously activated is arbitrary. In FIG. 10, the number of the address selecting MOSFETs Qa provided as dummy cells DC can be changed to 500 or 2,000, for example, and the static capacitance of the capacitor CD can be arbitrarily set. Moreover, the address selecting MOSFETs Qa composing the dummy cells DC can be arranged in a lattice shape, for example, on condition that their drains are coupled to the plate voltage VPL whereas their gates are coupled to the ground potential of the circuit.

In FIG. 12, the boosting ratio of the voltage-doubling word boost circuit VCHG may be switched in three or four stages, for example. In this modification, the discriminations of the internal supply voltage VCL by the level discriminating circuit LC have to be increased in accordance with the number of switching steps of the boosting ratio. The voltage-doubling word boost circuit VCHG including the clock pulse generator CPG may be selectively brought into the operative state on condition that the multi-port memory is brought into the selected state. Moreover, the high voltage supply point VCH may be equipped with a predetermined clamp circuit.

In FIGS. 15 and 16, the structures of the oscillators OSC1 and OSC2 and the charge pump circuits CP1 and CP2 are not restricted by this embodiment. Moreover, a variety of methods of monitoring the charge current of the charge pump capacitor C3 can be conceived in various manners. Moreover, a variety of modes of embodiment can be adopted for the specific circuit structures, the absolute values and polarities of the supply voltage, and the conductivity types of the MOSFETs of the individual portions shown in FIGS. 10 and 12 and FIGS. 15 and 16.

In the main description thus far made, our invention has been applied to a multi-port memory which is contained in the frame memory of a personal computer or the field of application of the background thereof, but should not be limited thereto. For example, the invention can also be applied to a similar multi-port memory or serial access memory which is contained in various digital processors such as work stations. The present invention can be widely applied both in a semiconductor memory device, which is equipped with at least the random access ports and serial access ports and which has to be backed up by the battery, and in a digital integrated circuit device including such semiconductor memory device.

EFFECTS OF THE INVENTION

A memory array such as the multi-port memory which has been described is composed of memory cells of stereoscopic structure such as STC cells, and the high voltage to be applied to the word lines to be brought into the selected state is generated by the voltage-doubling word boost circuit which has its boosting ratio switched stepwise in accordance with the potential of the internal supply voltage. Moreover, the substrate potential generator is constructed of: the first substrate potential generator having a relatively small current supplying capacity and adapted to be steadily brought into the operative state; and the second substrate potential generator having a relatively high current supplying capacity and adapted to be selectively brought into the operative state in response to at least the output signal of the level detecting circuit. The discrimination of the substrate potential by the level detecting circuit is accomplished by monitoring the charge current of the charge pump capacitance. Still moreover, the multi-port memory is set in the self-refresh mode at the battery backup time. The number of memory mats to be simultaneously activated in the self-refresh mode is made larger than that in the ordinary mode, and the refresh timer circuit for setting the refresh period is a diffusion layer leakage type timer circuit. As a result, even in case the supply voltage is supplied in a small absolute value from the battery, the data holding characteristics of the memory cells are improved while retaining the refresh period matching the data holding characteristics of the memory cells and the required word line selecting levels. Also, the power consumption of the multi-port memory can be reduced to permit successful use of the battery backup. As a result, the resume function of the digital process or the like including the multi-port memory can be realized without restricting the bit rate of the image data and the function as a frame memory.

We claim:

1. A semiconductor memory device arranged to be operated by a first power source comprising random access ports and serial ports and including a circuit arrangement to permit the semiconductor memory device to be backed up by a battery having a lower voltage level than said first power source, wherein said semiconductor memory device comprises a memory array includes a plurality of word lines to be selectively brought into selected states if selectively fed with a predetermined high voltage, and wherein said semiconductor memory device further comprises a voltage-doubling word boost circuit for boosting a supply voltage to generate said high voltage, wherein said voltage doubling word boost circuit will have a first boosting ratio when said supply voltage is provided by said first power source and a second boosting ratio greater than said first boosting ratio when said supply voltage is provided by said battery.

2. A semiconductor memory device of claim 1, further comprising:
   a first substrate potential generator having a relatively low current supply capacity and adapted to be steadily operated to generate a predetermined first substrate potential;
   a level detector for discriminating that an absolute value of said first substrate potential reaches a predetermined level; and
   a second substrate potential generator having a relatively high current and adapted to be selectively brought into an operative state in response to at least an output signal of said level detector thereby to generate a second substrate potential.

3. A semiconductor memory device of claim 2, wherein said fist substrate potential generator includes a charge pump capacitor, and wherein said level detector monitors a charge current to said charge pump capacitor to discriminate when an absolute value of said first substrate potential reaches a predetermined level.

4. A semiconductor memory device arranged to be operated by a first power source comprising random access ports and serial access ports and including a circuit arrangement to permit the semiconductor memory device to be backed up by a battery having a lower voltage level than said first power source, wherein said semiconductor memory device is brought into a self-refresh mode when it is backed up by the battery, and wherein the semiconductor memory device further comprises a refresh timer circuit for setting a refresh period at the time of said self-refresh mode.

5. A semiconductor memory device of claim 4, wherein said semiconductor memory device comprises a memory which array substantially divided into a plurality of mats, and wherein the semiconductor memory device includes a circuit to simultaneously activate more of said memory mats in said self-refresh mode than number of memory mats which are simultaneously activated in an ordinary operation mode in which said semiconductor memory device is powered by said first power source.

6. A semiconductor memory device of claim 4, wherein said refresh timer circuit is a diffusion layer leakage timer circuit including:
   a plurality of dummy cells;
   a capacitor connected between an internal node coupled commonly with sources of address selecting MOSFETs of said dummy cells and a plate voltage supply point and having an electrostatic capacitance about one tenth as high as a total value of the static capacitances of data storing capacitors of dynamic cells of said semiconductor memory corresponding to the same number of said dummy cells;
   a precharge circuit for precharging said internal node to a predetermined potential; and
   a level decision circuit for discriminating that the potential of said internal node has dropped to a predetermined level.

7. A semiconductor memory device arranged to be operated by a first power source comprising random access ports and serial access ports and including a circuit arrangement to permit the semiconductor memory device to be backed up by a battery having a lower voltage level than said first power source, wherein said semiconductor memory device is contained in a frame memory of a digital processor system including a display device and having a resume function.

8. A semiconductor memory device of claim 7, wherein said digital processor system further includes another memory device capable of being backed up by a battery so that it can be backed up in its entirety by the battery.

9. A semiconductor memory device of claim 2, wherein said semiconductor memory device is brought into a self-refresh mode when it is backed up by the battery, and wherein the semiconductor memory device further comprises a refresh timer circuit for setting a refresh period at the time of said self-refresh mode.

10. A semiconductor memory device of claim 9, wherein said memory array is substantially divided into a plurality of mats, and wherein the semiconductor memory device includes a circuit to simultaneously activate more of said memory mats in said self-refresh mode than a number of memory mats which are simultaneously activated in an ordinary operation mode in which said semiconductor memory device is powered by said first power source.

11. A semiconductor memory device of claim 9, wherein said refresh timer circuit is a diffusion layer leakage timer circuit including:
a plurality of dummy cells;
a capacitor connected between an internal node coupled commonly with sources of address selecting MOSFETs of said dummy cells and a plate voltage supply point and having an electrostatic capacitance about one tenth as high as a total value of the static capacitances of data storing capacitors of dynamic cells of said semiconductor memory corresponding to the same number of said dummy cells;
a precharge circuit for precharging said internal node to a predetermined potential; and
a level decision circuit for discriminating that the potential of said internal node has dropped to a predetermined level.

12. A semiconductor memory device of claim 11, wherein said semiconductor memory device is contained in a frame memory of a digital processor system including a display device and having a resume function.

13. A semiconductor memory device of claim 12, wherein said digital processor system further includes another memory device capable of being backed up by a battery so that it can be backed up in its entirety by the battery.

14. A semiconductor memory device of claimed 3, wherein said semiconductor memory device is brought into a self-refresh mode when it is backed up by the battery, and wherein the semiconductor memory device further comprises a refresh timer circuit for setting a refresh period at the time of said self-refresh mode.

15. A semiconductor memory device of claim 14, wherein said memory array is substantially divided into a plurality of mats, and wherein the semiconductor memory device includes a circuit to simultaneously activate more of said memory mats in said self-refresh mode than a number of memory mats which are simultaneously activated in an ordinary operation mode in which said semiconductor memory device is powered by said first power source.

16. A semiconductor memory device of claim 14, wherein said refresh timer circuit is a diffusion layer leakage timer circuit including:
a plurality of dummy cells;
a capacitor connected between an internal node coupled commonly with sources of address selecting MOSFETs of said dummy cells and a plate voltage supply point and having an electrostatic capacitance about one tenth as high as a total value of the static capacitances of data storing capacitors of dynamic cells of said semiconductor memory corresponding to the same number of said dummy cells;
a precharge circuit for precharging said internal node to a predetermined potential; and
a level decision circuit for discriminating that the potential of said internal node has dropped to a predetermined level.

17. A semiconductor memory device of claim 16, wherein said semiconductor memory device is contained in a frame memory of a digital processor system including a display device and having a resume function.

18. A semiconductor memory device of claim 17, wherein said digital processor system further includes another memory device capable of being backed up by a battery so that it can be backed up in its entirety by the battery.

19. A semiconductor memory device, including random access ports and serial access ports, arranged to be operated by a first power source, and comprising:
a memory array, coupled to the random access ports, having a plurality of dynamic type memory cells each of which includes a capacitor for storing information as charges;
an external power supply terminal for receiving a power supply voltage;
a plurality of external terminals for including at least one external terminal for receiving a control signal which is a signal for controlling an operating to said memory array; and
means responsive to a predetermined combination of signals supplied to said external terminals for permitting the memory array to be backed up by a battery having a lower voltage level than the first power source.

20. A semiconductor memory device according to claim 19, further comprising a serial memory coupled to the memory array and to the serial access ports.

21. A semiconductor memory device according to claim 19, wherein said external power supply terminal receives one of the first power source and the battery as the power supply voltage.

22. A semiconductor memory device according to claim 21, wherein the memory array includes a plurality of word lines coupled to the dynamic type memory cells, wherein the semiconductor memory device includes selection means coupled to the word lines for selectively providing a predetermined high voltage to one of the word lines and a word boost circuit for boosting the power supply voltage to generate the high voltage, and wherein the word boost circuit has a first boosting ratio when the supply voltage is provided by the first power source and a second boosting ratio greater than the first boosting ratio when the supply voltage is provided by the battery.

23. A semiconductor memory device according to claim 21, further comprising refresh control means responsive to the predetermined combination for indicating predetermined ones of the dynamic type memory cells to be refreshed so as to perform refresh operations for the predetermined ones of the dynamic type memory cells in the memory array when the memory array is backed up by the battery.

24. A semiconductor memory device according to claim 23, wherein the memory array includes a plurality of word lines coupled to the dynamic type memory cells, wherein the semiconductor memory device includes selection means coupled to the word lines for selectively providing a predetermined high voltage to one of the word lines and a word boost circuit for boosting the power supply voltage to generate the high voltage, and wherein the word boost circuit has a first boosting ratio when the supply voltage is provided by the first power source and a second boosting ratio greater than the first boosting ratio when the supply voltage is provided by the battery.

* * * * *